(12) United States Patent
Kamikawa et al.

(10) Patent No.: US 12,389,714 B2
(45) Date of Patent: Aug. 12, 2025

(54) METHOD OF FABRICATING NON-POLAR AND SEMI-POLAR DEVICES USING EPITAXIAL LATERAL OVERGROWTH

(71) Applicant: The Regents of the University of California, Oakland, CA (US)

(72) Inventors: Takeshi Kamikawa, Santa Barbara, CA (US); Srinivas Gandrothula, Santa Barbara, CA (US); Hongjian Li, Goleta, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 40 days.

(21) Appl. No.: 16/978,493

(22) PCT Filed: Apr. 1, 2019

(86) PCT No.: PCT/US2019/025187
§ 371 (c)(1),
(2) Date: Sep. 4, 2020

(87) PCT Pub. No.: WO2019/191760
PCT Pub. Date: Oct. 3, 2019

(65) Prior Publication Data
US 2021/0013365 A1 Jan. 14, 2021

Related U.S. Application Data
(60) Provisional application No. 62/650,487, filed on Mar. 30, 2018.

(51) Int. Cl.
*H10H 20/01* (2025.01)
*C30B 25/04* (2006.01)
(Continued)

(52) U.S. Cl.
CPC ....... *H10H 20/01335* (2025.01); *C30B 25/04* (2013.01); *C30B 29/403* (2013.01);
(Continued)

(58) Field of Classification Search
CPC ............... H01L 33/007; H01L 21/0242; H01L 21/0254; H01L 21/02609; H01L 21/02639;
(Continued)

(56) References Cited

U.S. PATENT DOCUMENTS

2007/0164306 A1\* 7/2007 Nakahata ...................... 257/103
2008/0308906 A1 12/2008 Osada et al.
(Continued)

FOREIGN PATENT DOCUMENTS

CN 107407008 11/2017
JP 2006186257 A 7/2006
(Continued)

OTHER PUBLICATIONS

PCT International Search Report & Written Opinion dated Jun. 17, 2019 for PCT Application No. PCT/US2019/025187.
(Continued)

*Primary Examiner* — Julia Slutsker
(74) *Attorney, Agent, or Firm* — Gates & Cooper LLP

(57) ABSTRACT

A method of fabricating a semiconductor device, comprising: forming a growth restrict mask on or above a III-nitride substrate, and growing one or more island-like III-nitride semiconductor layers on the III-nitride substrate using the growth restrict mask. The III-nitride substrate has an in-plane distribution of off-angle orientations with more than 0.1 degree; and the off-angle orientations of an m-plane oriented crystalline surface plane range from about +28 degrees to about −47 degrees towards a c-plane. The island-like III-nitride semiconductor layers have at least one long
(Continued)

side and short side, wherein the long side is perpendicular to an a-axis of the island-like III-nitride semiconductor layers. The island-like III-nitride semiconductor layers do not coalesce with neighboring island-like III-nitride semiconductor layers.

18 Claims, 34 Drawing Sheets

(51) Int. Cl.
    *C30B 29/40*     (2006.01)
    *H01L 21/02*     (2006.01)
    *H01S 5/042*     (2006.01)
    *H01S 5/22*     (2006.01)
    *H01S 5/343*     (2006.01)
    *H10D 62/40*     (2025.01)
    *H10D 62/85*     (2025.01)
    *H10H 20/818*     (2025.01)
    *H10H 20/825*     (2025.01)

(52) U.S. Cl.
    CPC ...... *H01L 21/0242* (2013.01); *H01L 21/0254* (2013.01); *H01L 21/02609* (2013.01); *H01L 21/02639* (2013.01); *H01L 21/02647* (2013.01); *H01S 5/0425* (2013.01); *H01S 5/221* (2013.01); *H01S 5/2214* (2013.01); *H01S 5/34333* (2013.01); *H10D 62/405* (2025.01); *H10D 62/8503* (2025.01); *H10H 20/818* (2025.01); *H10H 20/825* (2025.01)

(58) Field of Classification Search
    CPC ............. H01L 21/02647; H01L 29/045; H01L 29/2003; H01L 33/18; H01L 33/32; H01L 21/02389; H01L 21/02433; H01L 21/02576; H01L 21/02579; H01L 21/0262; H01L 21/02642; H01L 21/7806; C30B 25/04; C30B 29/403; H01S 5/0425; H01S 5/221; H01S 5/2214; H01S 5/34333; H01S 2304/12; H10H 20/01335; H10H 20/818; H10H 20/825; H10D 62/405; H10D 62/8503; H10D 30/875; A01N 1/146; H05K 5/10

See application file for complete search history.

(56) References Cited

U.S. PATENT DOCUMENTS

| | | | |
|---|---|---|---|
| 2011/0068347 A1* | 3/2011 | Strittmatter | H01L 21/0254 |
| | | | 257/E29.089 |
| 2012/0319156 A1 | 12/2012 | Yokogawa et al. | |
| 2013/0016750 A1 | 1/2013 | Raring et al. | |
| 2017/0033533 A1* | 2/2017 | Hamaguchi | H01S 5/18361 |
| 2017/0092810 A1 | 3/2017 | Raring et al. | |

FOREIGN PATENT DOCUMENTS

| | | |
|---|---|---|
| JP | 2008501606 A | 1/2008 |
| JP | 2012-36030 | 2/2012 |
| WO | 2019055936 | 3/2019 |
| WO | 2019055936 A1 | 3/2019 |

OTHER PUBLICATIONS

European Extended Search Report dated Nov. 25, 2021 for EP Application No. 19777104.1.
Japanese Notice of Reasons for Refusal dated Mar. 28, 2023 for Japanese Application No. 2021-502737.
Japanese Decision of Rejection dated Oct. 31, 2023 for Japanese Application No. 2021-502737.
Chinese Office Action (with English translation) dated Sep. 21, 2023 for Chinese Patent Application No. 201980034576.0.
Chinese Second Examination Opinion Notice dated Jun. 14, 2024 for Chinese Application No. 201980034576.0.
Japanese Report of Reconsideration dated Jun. 25, 2024 for Japanese Patent Application No. 2021-502737.

* cited by examiner

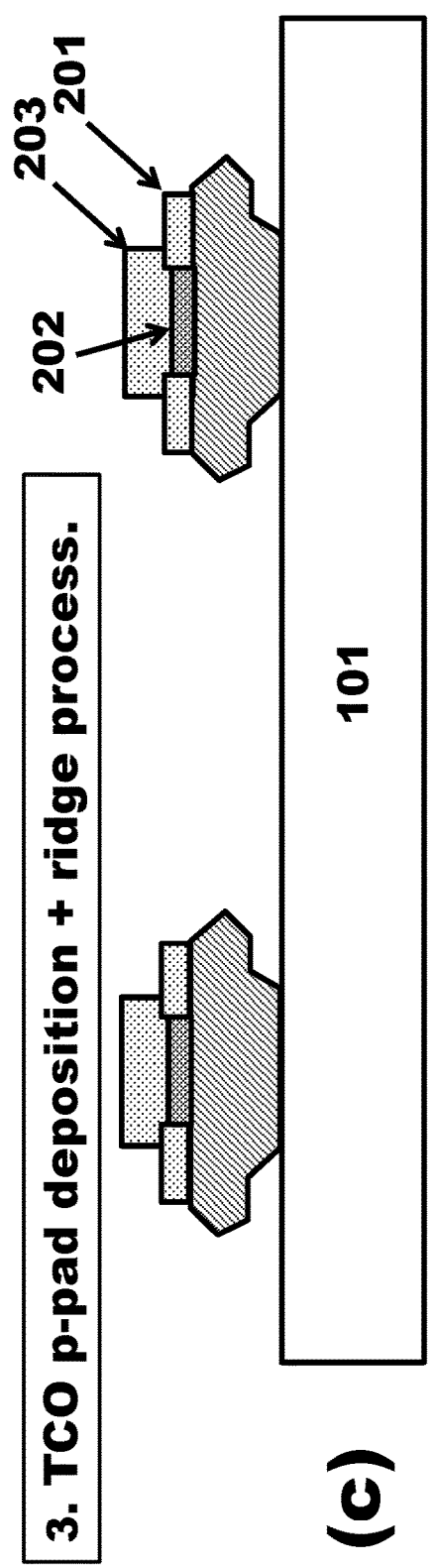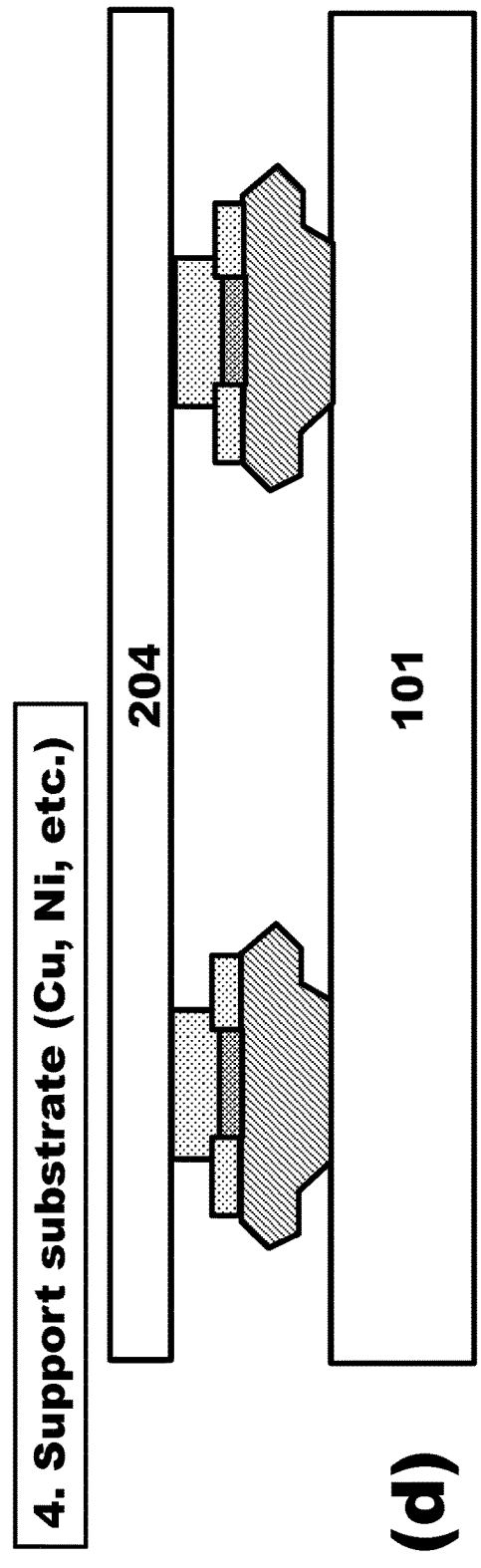
Fig. 2

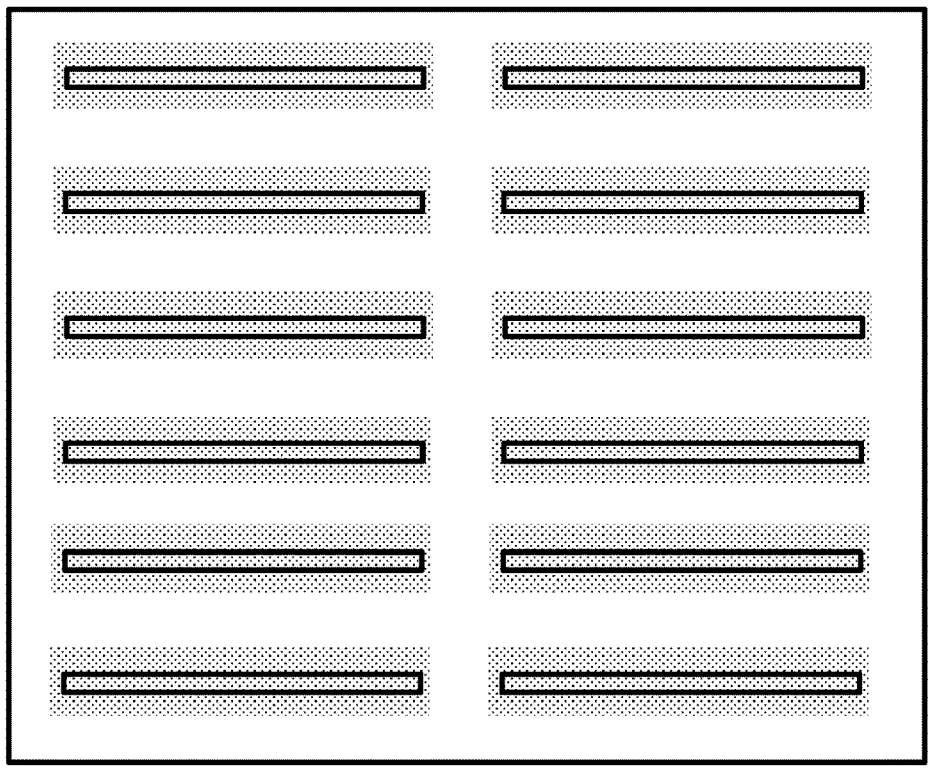
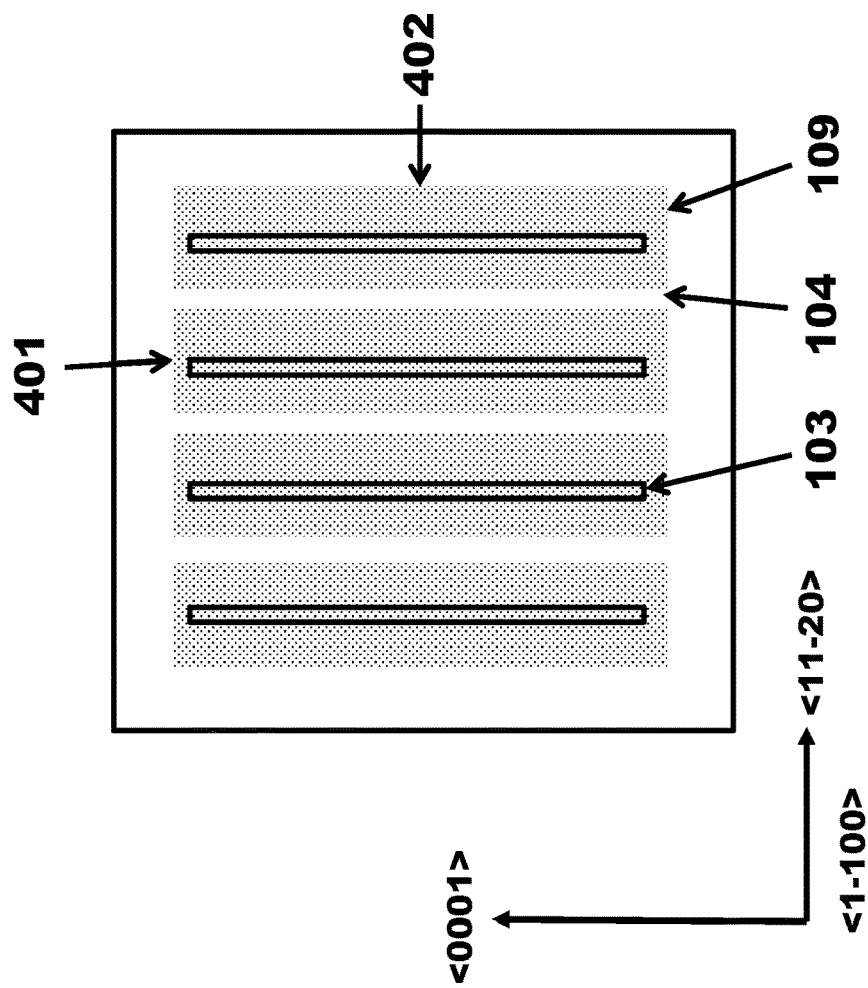
Fig. 4(a)
Fig. 4(b)

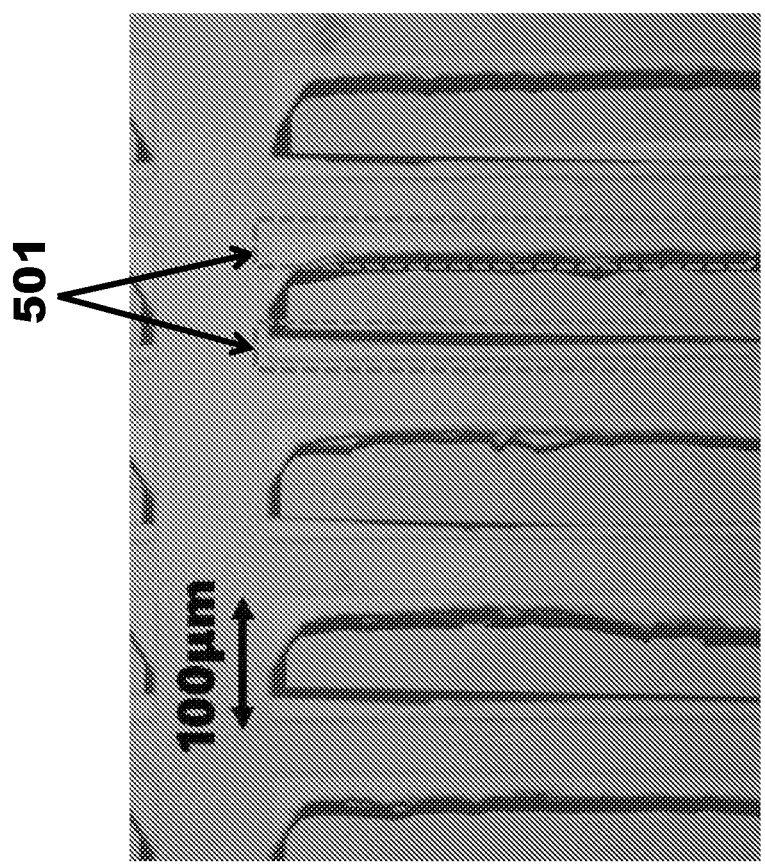

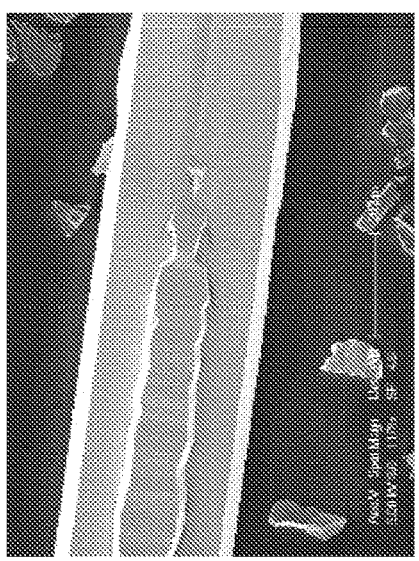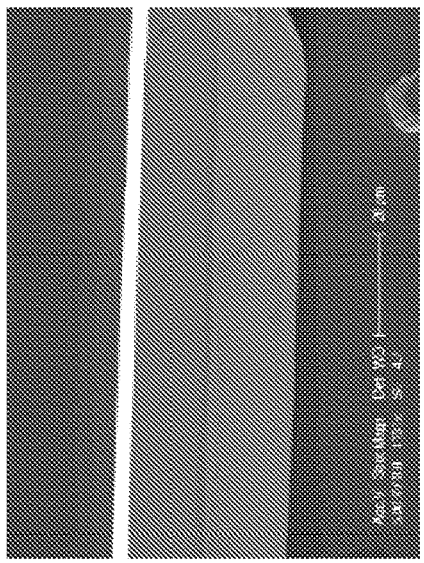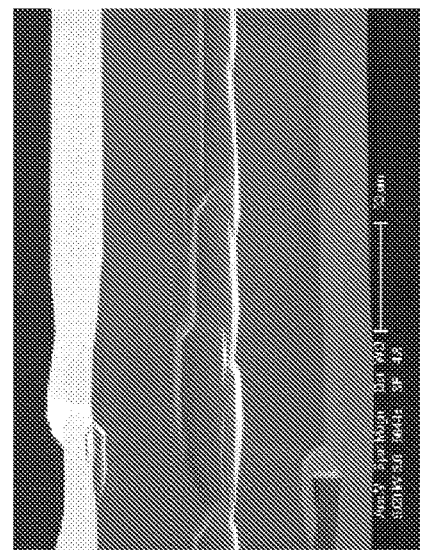
Fig. 6(a)

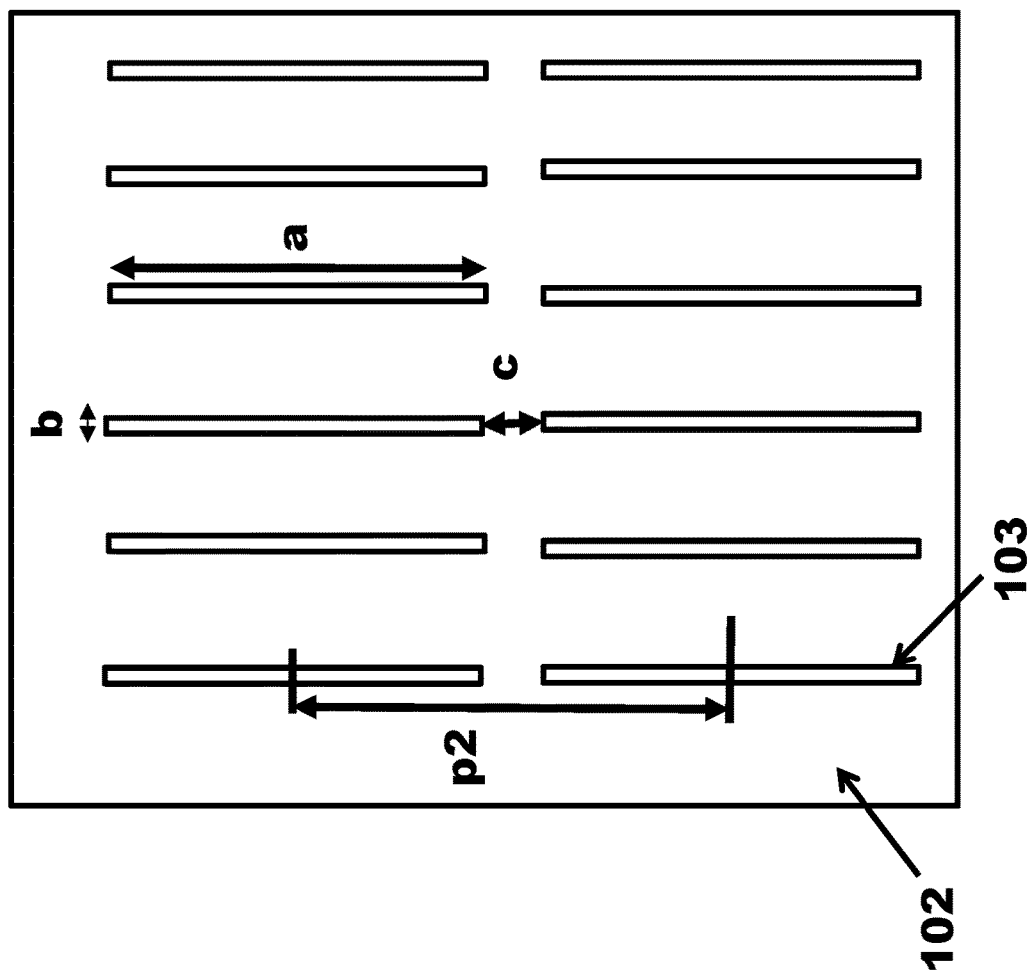

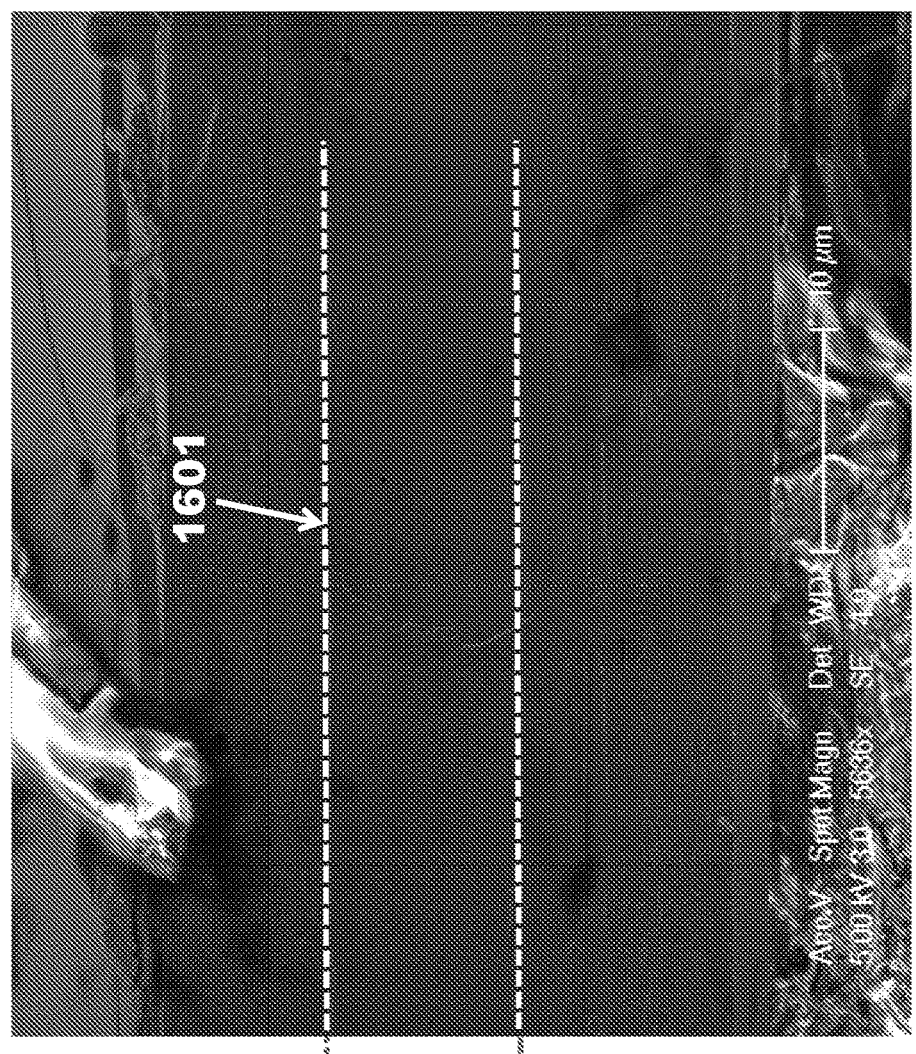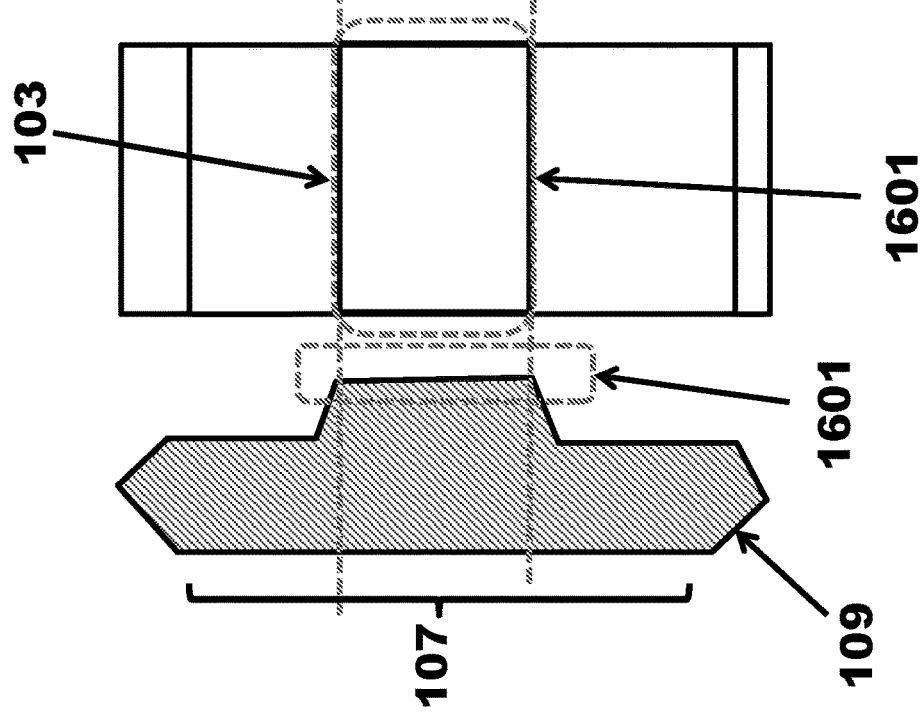
Fig. 16

METHOD OF FABRICATING NON-POLAR AND SEMI-POLAR DEVICES USING EPITAXIAL LATERAL OVERGROWTH

CROSS REFERENCE TO RELATED APPLICATIONS

This application claims the benefit under 35 U.S.C. Section 119(e) of commonly-assigned U.S. Provisional Patent Application Ser. No. 62/650,487, filed on Mar. 30, 2018, by Takeshi Kamikawa, Srinivas Gandrothula, and Hongjian Li, entitled "METHOD OF FABRICATING NON-POLAR AND SEMI-POLAR DEVICES BY USING LATERAL OVERGROWTH," which application is incorporated by reference herein.

BACKGROUND OF THE INVENTION

1. Field of the Invention

This invention relates to a method for fabricating non-polar and semi-polar devices using epitaxial lateral overgrowth.

2. Description of the Related Art

Some device manufacturers have used non-polar and semi-polar GaN substrates to produce laser diodes (LDs) and light emitting diodes (LEDs) for lighting, optical storage, etc. Non-polar and semi-polar GaN substrates are used to avoid large pyro- and piezo-electric fields, which can result in significant improvements in the emission efficiency. However, epitaxial growth of III-nitrides along non-polar and semi-polar directions is more difficult than growth along a polar c-plane direction.

According to US20170092810A1, a number of pyramidal hillocks were observed on the surface of non-polar m-plane III-nitride films after epitaxial growth. Furthermore, a wavy surface appeared, which made the surface roughness worse. It is very severe problem when a laser structure is fabricated on the surface, because this surface roughness may cause uniformity of optical gain and fluctuations of device processes. It may also decrease the yield of the device processes. Furthermore, reliability of the laser is affected by hillocks and large surface roughness. See, e.g., Applied Physics Letters 91, 191906 (2007).

According to this paper, the growth conditions for obtaining a smooth surface are very narrow and with strict limitations. One problem is that surface morphology is affected by off-angle orientation, and it is well known that GaN wafers have a large in-plane distribution with regards to off-angle orientations. Consequently, the surface morphology greatly changes within the wafer. In this case, the yield is low, which is a big problem. See, e.g., Physica Status Solidi (a), Volume 214, Issue 8, 1600829 (2047).

Furthermore, according to this paper, the hillock's facet dependence on leakage current under reverse-biased conditions was observed. They showed that the leakage current distribution was caused by the hillock's facet dependence on the carrier concentration and oxygen concentration. The leakage current distribution is a problem when making devices, such as LEDs, LDs, power devices such as Schottky barrier diodes (SBDs), or metal-oxide-semiconductor field-effect-transistors (MOSFETs).

Another problem is growing epi-layers on a growth restrict mask using a non-polar and semi-polar III-nitride substrate results in the epi-layers coalescing at the center of an opening area in the mask. In this case, the island-like III-nitride layers have a concave region or depression at the near-center of the epi-layers. Under different growth conditions, there are cases where the island-like III-nitride layers have a convex region or elevation at the near-center of the epi-layers. Both cases present problems when attempting to obtain a flat surface of the epi-layers.

Thus, there is a need in the art for improved methods for flattening the epilayer on the non-polar and semi-polar substrate using epitaxial lateral overgrowth (ELO). The present invention satisfies this need.

SUMMARY OF THE INVENTION

To overcome the limitations in the prior art described above, and to overcome other limitations that will become apparent upon reading and understanding this specification, the present invention discloses a method of fabricating a semiconductor device, comprising: forming a growth restrict mask on or above a III-nitride substrate, wherein: the III-nitride substrate has an in-plane distribution of off-angle orientations with more than 0.1 degrees; the off-angle orientations of an m-plane oriented crystalline surface plane ranges from about +28 degrees to about −47 degrees towards a c-plane; and growing one or more island-like III-nitride semiconductor layers on the III-nitride substrate using the growth restrict mask. The island-like semiconductor layers are then removed from the III-nitride substrate.

The resulting island-like III-nitride semiconductor layer has a just-orientation and an off-angle orientation of an m-plane oriented crystalline surface plane, wherein: the off-angle orientation of the m-plane oriented crystalline surface plane ranges from about +28 degrees to about −47 degrees towards a c-plane; the island-like III-nitride semiconductor layers have at least one long side and short side, wherein the long side is perpendicular to an a-axis of the island-like III-nitride semiconductor layers; and the island-like III-nitride semiconductor layers do not coalesce with neighboring island-like III-nitride semiconductor layers.

The island-like III-nitride semiconductor layers have an emitting region, wherein the emitting region is at least 1 μm from an edge of a layer bending region of the island-like III-nitride semiconductor layers. The emitting region is more than 5 μm from an edge of a top surface of the island-like III-nitride semiconductor layers.

The island-like III-nitride semiconductor layers have an edge growth region with a height less than 0.2 μm, wherein the edge growth region has a width less than 5 μm.

The island-like III-nitride semiconductor layers also have a separate region where an n-electrode is formed.

The present invention also discloses a method for growing a flat III-nitride epi-layer on a semi-polar and non-polar III-nitride substrate using ELO, thereby reducing or eliminating pyramidal hillocks, wavy surfaces, and concave or convex regions.

In one aspect, it has been realized that the edge of the substrate causes the roughness of the surface to deteriorate. Therefore, a region of growth (e.g., an opening area in a growth restrict mask) needs to be isolated from the edge of the substrate. In this invention, the region of growth has been isolated by the growth restrict mask.

Furthermore, the substrate may have pits and defects on its surface, which results in a rough surface after epitaxial growth using metal-organic chemical vapor deposition (MOCVD). This have been well-known for some time. One pit may affect the surface roughness in a large area. However, separating each of the regions of growth can prevent worse surface roughness in adjacent regions. In semi-polar and non-polar epitaxial growth, it is important for the regions of growth to be isolated from the edge of substrate and to not affect a large area.

In other words, the region of growth is surrounded with the growth restrict mask, which isolates the region of growth. For example, the growth restrict mask may be a dielectric film or metals, such as $SiO_2$, SiN, $HfO_2$, $Al_2O_3$, MgF, W, Mo, etc. Furthermore, the growth restrict mask may use multiple layers selected from these materials.

A III-nitride layer grown using the ELO method is called an ELO III-nitride layer. When the ELO III-nitride layer is grown using MOCVD or HVPE, a carrier gas flow includes a Hydrogen gas.

If the ELO III-nitride layers coalesce with each other, it causes fluctuations in the surface roughness. Furthermore, the region of coalescence causes many stacking faults and misfit dislocations.

Therefore, in this invention, the growth of the ELO III-nitride layer is stopped before the adjacent island-like layers coalesce with each other. Then, the flat region of the ELO III-nitride layer is substantially free from hillocks. Thereafter, III-nitride semiconductor device layers are grown on the ELO III-nitride layer, and the III-nitride semiconductor device layers are removed from the III-nitride substrate. These are separated from each other because MOCVD growth is stopped before they coalesce. The method obtains flat surface layers and device layers with high yield.

The present invention can use a III-nitride substrate or a hetero-substrate. More preferably, the present invention uses the III-nitride substrate, in order to obtain high quality III-nitride-based semiconductor layers and to avoid bowing or curvature of the substrate during epitaxial growth. The present invention also obtains low defect density devices.

As long as it enables growth of a III-nitride based semiconductor layer through a growth restrict mask, any III-nitride based substrate or hetero-substrate, such as sapphire, SiC, $LiAlO_2$, Si, etc., can be used.

Moreover, III-nitride based semiconductor layers and a III-nitride based substrate may also include Al, In, and B, as well as other impurities such as Mg, Si, O, C, H, etc.

The ELO III-nitride layers are epitaxially grown on the III-nitride substrate at an opening area and/or through an intermediate layer at the opening area. The quality of the ELO III-nitride layer and the III-nitride semiconductor device layers are extremely high, and a device comprised of the island-like III-nitride based semiconductor layers is of extremely high quality. Furthermore, the island-like III-nitride semiconductor layers have a flat surface morphology without hillocks, which usually appear on an epi-layer surface after growing the epi-layer on a non-polar and semi-polar substrate.

In MOCVD or HVPE, it is better to use carrier gases that include Hydrogen gas. Hydrogen plays a crucial role in the beginning of the growth. According to the prior art, it has been shown that a Hydrogen carrier gas makes the surface morphology worse during GaN layer growth with MOCVD. However, when the region of growth is surrounded with a growth restrict mask, the situation changes.

Carrier gases that include Hydrogen effectively etch an edge-side of the epi-layers in an opening area. This effect prevents the epi-layers from beginning growth at both sides of the opening area.

If carrier gases do not include Hydrogen, there are a lot of cores of the epi-layers at both sides of an opening area. With further growth, cores of the epi-layers would coalesce at or near the center of opening area. Therefore, the ELO III-nitride layer has a depressed region. This growth has been happened on a variety of non-polar and semi-polar planes.

On the other hand, carrier gases that include Hydrogen gas may be used, where the cores of the epi-layers form at or near the center of opening area in the early stage of growth. In this case, the ELO III-nitride layer does not have any depressed regions or pyramidal hillocks, and a very flat and smooth surface roughness can be obtained.

For above reasons, when the ELO III-nitride layer is grown, it would better to use a carrier gas including Hydrogen at least during the beginning of growth. Moreover, the carrier gas can be only Hydrogen gas or a mix of Hydrogen gas and Nitrogen gas.

In this invention, it is also possible to remove the island-like layers from the substrate. It is difficult for a homo-epitaxial layer to be removed from a substrate, because there is no hetero-interface between the homo-epitaxial layer and the substrate's surface. However, using this invention, the homo-epitaxial island-like layers can be removed from the substrate in a fast and easy manner.

For example, the method of removing substrate may use a growth restrict mask, which may be a dielectric film or metals, such as $SiO_2$, SiN, $HfO_2$, $Al_2O_3$, MgF, etc. The interface between the growth restrict mask and any subsequent III-nitride layers grown by ELO on the mask has a weak bonding strength. The bonding area. (opening area width) is controlled to be more or less than the chip size. Besides, the ELO method provides a cleaving point and cleaving interface. Thus, it is easy to peel off the homo-epitaxial layers from the substrate.

Furthermore, these methods use cleavage with the m-plane. The m-plane is the easiest plane among GaN planes to cleave. This method also can determine the cleaving point in an easy manner. For example, the cleaving point may be an edge of the growth restrict mask. One improvement is to dissolve the mask using a hydrofluoric acid (HF), buffered HF (BHF), or another etchant, before removing the substrate.

Thereafter, the wafer is bonded to a support substrate using a low temperature melted metal and/or solder, wherein the metal is dissolved by the etchant. The bonding parts are the III-nitride layers on the III-nitride substrate. It is possible to utilize support substrates that have a thermal expansion different from the III-nitride substrate. Both substrates are heated or cooled after bonding. Stress is applied to the III-nitride layers that are bonded to the support substrate due to differences in thermal expansion. This stress is applied to the portion of the III-nitride layers that are between the III-nitride layer and the substrate. The cleave starts from a cleaving point that is an edge of the growth restrict mask. In the end, the cleave reaches an opposite side of the cleaving point. However, a trigger is needed in order to start the cleave.

As in the above case, the cleave may be triggered using the stress from the difference in thermal expansion. However, it may be unnecessary to use such stress. For example, the cleave may be triggered using ultra-sonic waves, etc. If mechanical removal, such as ultra-sonic cleaving, can be used, the substrate can be removed quickly and with very weak stress, due to the cleaving of the m-plane. Furthermore, the cleaving point is a wedge shape, which makes the determination of the cleaving point easy. Moreover, the shape of the cleaving point is important to achieve a high yield.

Using these methods, device layers can be easily removed from the III-nitride-based substrates and wafers, including wafers of large size, e.g., over 2 inches.

In addition, the island-like III-nitride based semiconductor layers do not coalesce with each other, and internal strain is released, which avoids any occurrences of cracks.

As a main purpose of this present invention, even if the III-nitride based substrate or hetero-substrate has a large in-plane distribution of off-angle orientations, a smooth surface is obtained with a large area without hillocks or wavy roughness.

In the present invention, the island-like III-nitride layer need not be removed from the substrate. If the island-like III-nitride layer is removed from the substrate, the process described above can be used.

BRIEF DESCRIPTION OF THE DRAWINGS

Referring now to the drawings in which like reference numbers represent corresponding parts throughout:

FIGS. 4(a) and 4(b) are schematics illustrating a growth restrict mask, according to an embodiment of the present invention.

FIG. 5 is a photograph illustrating experimental results, according to an embodiment of the present invention.

FIGS. 6(a), 6(b), 6(c), 6(d), 6(e), 6(f), 6(g), 6(h) and 6(i) are photographs illustrating experimental results, according to an embodiment of the present invention.

FIGS. 7(a), 7(b) and 7(c) are schematics illustrating a growth restrict mask, according to an embodiment of the present invention.

FIG. 16 is a schematic and photograph illustrating experimental results, according to an embodiment of the present invention.

DETAILED DESCRIPTION OF THE INVENTION

Figure 1:
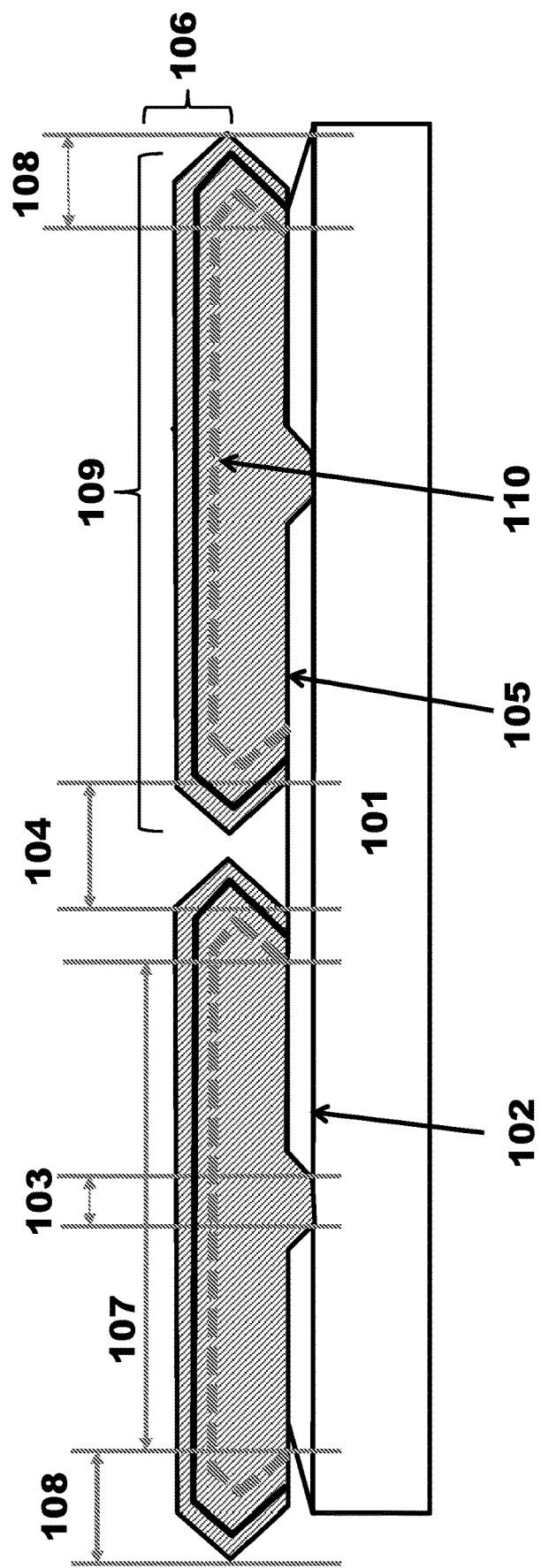
FIG. 1 is a schematic of a structure comprised of a substrate with various layers deposited thereon, according to an embodiment of the present invention.

In the following description of the preferred embodiment, reference is made to a specific embodiment in which the invention may be practiced. It is to be understood that other embodiments may be utilized and structural changes may be made without departing from the scope of the present invention.

Overview

The present invention describes a method of fabricating a semiconductor device, including obtaining a smooth and flat surface for an epitaxial III-nitride layer grown on a non-polar or semi-polar III-nitride substrate, and then manufacturing a semiconductor device on that surface.

In one embodiment, the method comprises the steps of:
forming a growth restrict mask with a plurality of striped opening areas directly or indirectly upon a substrate, which may be a III-nitride substrate or a hetero-substrate, wherein:
the substrate has an in-plane distribution of off-angle orientations with more than 0.1 degrees; the off-angle orientations of an m-plane oriented crystalline surface plane range from about +28 degrees to about −47 degrees towards a c-plane; and
the opening areas have long sides and short sides, the long sides are perpendicular to an a-axis direction; and
growing one or more island-like III-nitride semiconductor layers on the substrate using the growth restrict mask, wherein:
the island-like III-nitride based semiconductor layers are grown in a Hydrogen atmosphere; and
the growth extends in a direction parallel to the striped opening areas of the growth restrict mask, wherein the island-like III-nitride based semiconductor layers do not coalesce; and
removing the island-like III-nitride semiconductor layers from the III-nitride substrate.

The resulting island-like III-nitride semiconductor layers have a just-orientation and an off-angle orientation of an m-plane oriented crystalline surface plane, wherein: the off-angle orientation of the m-plane oriented crystalline surface plane ranges from about +28 degrees to about −47 degrees towards a c-plane; the island-like III-nitride semiconductor layers have at least one long side and short side, wherein the long side is perpendicular to an a-axis of the island-like III-nitride semiconductor layers; and the island-like III-nitride semiconductor layers do not coalesce with neighboring island-like III-nitride semiconductor layers.

The island-like III-nitride semiconductor layers have an emitting region, wherein the emitting region is at least 1 μm from an edge of a layer bending region of the island-like III-nitride semiconductor layers, and the emitting region is more than 5 μm from an edge of a top surface of the island-like III-nitride semiconductor layers.

The island-like III-nitride semiconductor layers have an edge growth region with a height less than 0.2 μm and a width less than 5 μm.

The island-like III-nitride semiconductor layers also have a separate region where an n-electrode is formed.

Finally, a device fabricated using the island-like III-nitride semiconductor layers may comprise a light-emitting diode (LED), laser diode (LD), Schottky barrier diode (SBD), or metal-oxide-semiconductor field-effect-transistor (MOSFET), which is processed on a flat surface region and/or the opening areas.

Semiconductor Structure and Fabrication Method

FIG. 1 is a schematic that illustrates a semiconductor structure according to an embodiment of the present invention, wherein the structure includes a substrate 101, growth restrict mask 102, opening areas 103, no-growth region 104, ELO III-nitride layer 105, III-nitride semiconductor device layers 106, flat surface region 107, layer bending region 108, and island-like III-nitride semiconductor layers 109 (which are formed on the flat surface region 107 and layer bending region 108) that may include a light emitting region 110.

The method for fabricating the semiconductor structure includes the following steps:

1. ELO+III-Nitride Semiconductor Layers.

Figure 2:
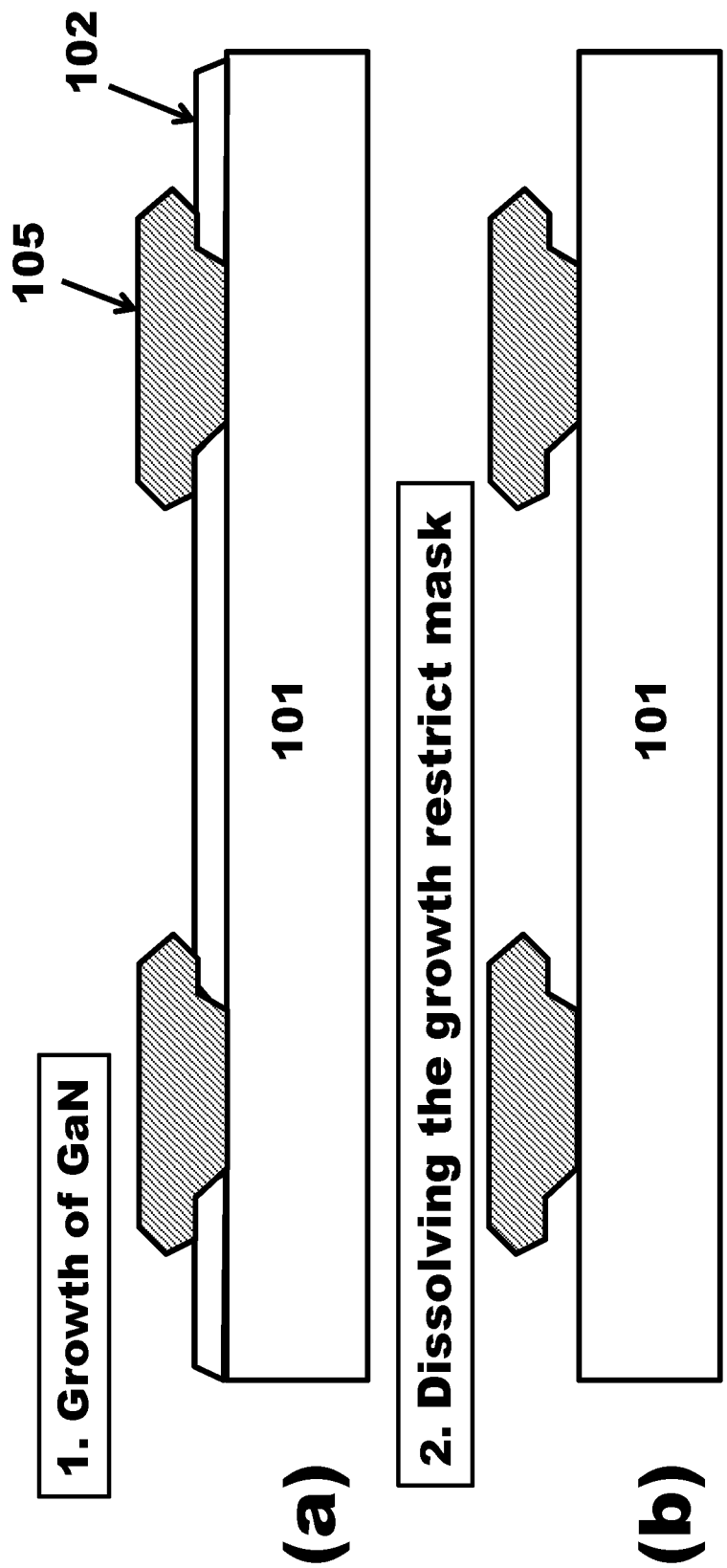
FIGS. 2(a), 2(b), 2(c), 2(d), 2(e) and 2(f) are schematics illustrating fabrication of the structure, according to an embodiment of the present invention.
Figure 2:
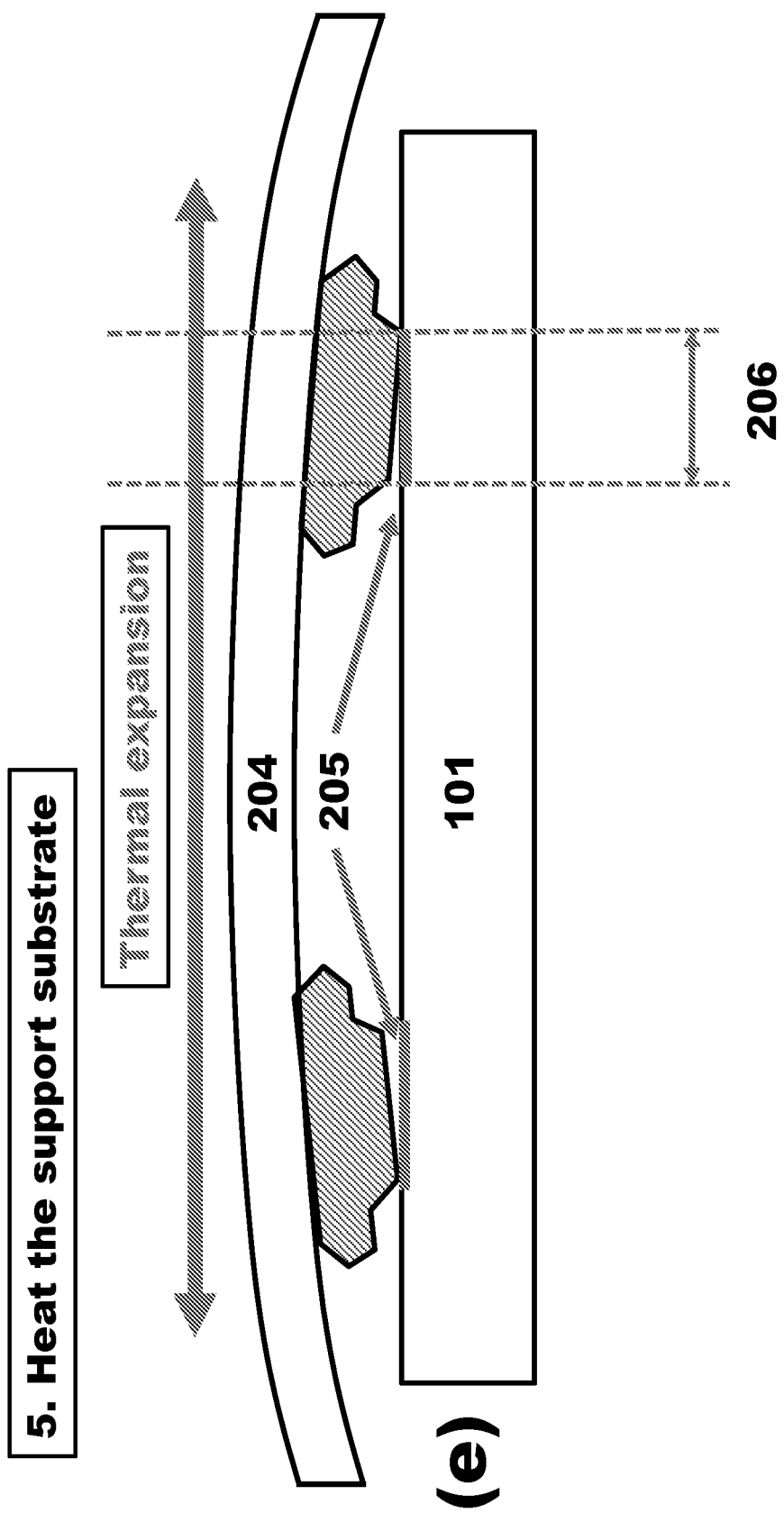
Figure 2:
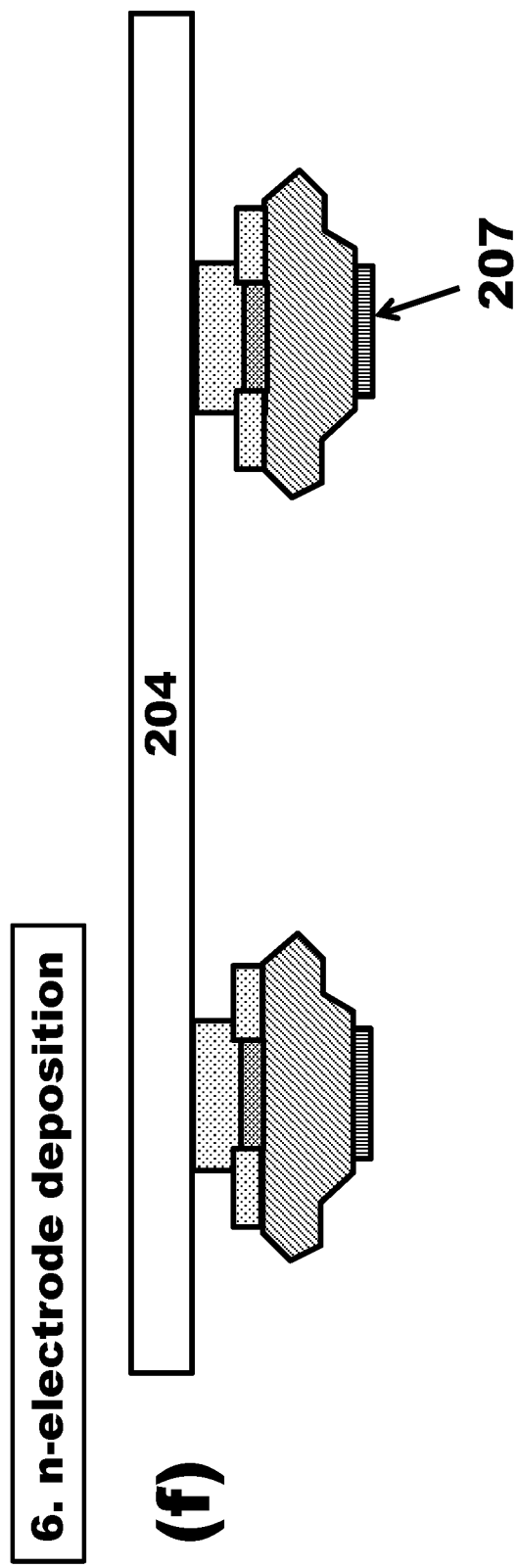

As shown in FIG. 2(a), III-nitride layers 105, such as GaN layers, are grown by ELO on a substrate 101 patterned with an SiO$_2$ growth restrict mask 102.

The substrate 101 may comprise, for example, a GaN substrate, AlN substrate, m-plane sapphire substrate, etc. In one embodiment, a GaN substrate 101 is used that has a growth surface that is m-plane with an off-angle from −47 degrees to +47 degrees towards a c-plane (0001).

The patterned SiO$_2$ of the growth restrict mask 102 has a width of 20 μm and an interval of 150 μm, wherein the SiO$_2$ stripes of the growth restrict mask 102 are along the <0001> axis. The ELO III-nitride layers 105 do not coalesce on top of the SiO$_2$ of the growth restrict mask 102. Epi-layers including III-nitride semiconductor device layers 106 are then grown, having flat surface region 107 and layer bending region 108, resulting in island-like III-nitride semiconductor layers 109, which may include GaN layers, AlGaN layers, AlInGaN layers, etc.

A ridge process may then be carried out on the island-like III-nitride semiconductor layers 109 on the flat surface region 107 to form LD device. Alternatively, an LED device or other device may be fabricated.

2 Dissolving the Growth Restrict Mask by Wet Etching.

As shown in FIG. 2(b), the SiO$_2$ of the growth restrict mask 102 is dissolved using a chemical solution, such as hydrofluoride (HF), buffered HF (BHF), etc., or otherwise removed This makes it easier to cleave devices from the GaN substrate 101. This process is best performed before removing the epi-layers from the substrate 101.

3. TCO p-Pad Deposition+Ridge Process.

As show in FIG. 2(c), a ZrO$_2$ layer 201 is patterned, and top-side p-contacts 202, such as TCO (Transparent Conductive Oxide), are deposited on the devices, followed by a p-pad 203. In addition, p-AlGaN cladding layers and electrodes can be used, but this invention is not limited those structures.

4. Bonding the Support Substrate.

As shown in FIG. 2(d), the devices are flip-chip bonded to a carrier wafer (Si, Cu, Cu—W, etc.) as a support substrate 204 using metal-metal bonding or soldering techniques.

5. Heat the Support Substrate.

As shown in FIG. 2(c), the support substrate 204 is heated to remove the devices from the substrate 101 at a cleaving point 205 and across a cleaving surface 206. Alternatively, the support substrate 204 may be cooled to accomplish this function.

6. N-Electrode Deposition.

As shown in FIG. 2(f), back-side n-contacts 207, such as TCO, Ti/Al, Ti/Au, Hf/Al/Mo/Au, etc., are deposited on to the devices. However, the n-contacts 207 are not limited those materials.

6. Chip Scribing.

Figures 3A, 3B:
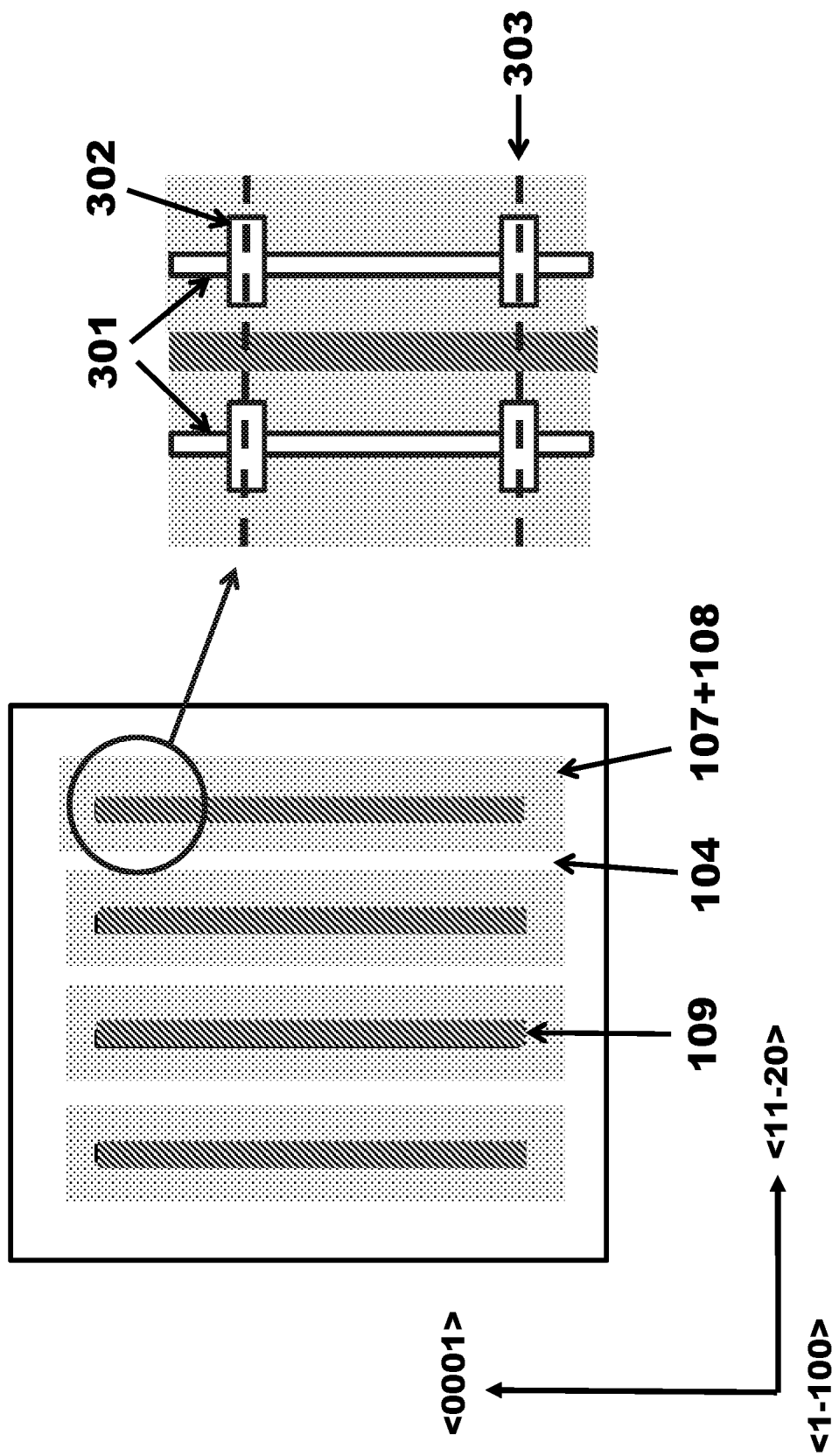
FIGS. 3(a) and 3(b) are schematics illustrating growth of semiconductor layers on a growth restrict mask, according to an embodiment of the present invention.

Chip scribing may be performed to separate the devices, as shown in FIGS. 3(a)-3(b), wherein FIG. 3(a) shows a top view of the flat surface regions 107, layer bending regions 108, and island-like III-nitride based semiconductor layers 109, separated by no-growth regions 104, and FIG. 3(b) is an enlarged portion of FIG. 3(a) that shows additional features of the LD devices, including ridge stripe structures 301, etched mirror regions 302 and chip scribe lines 303.

Definitions of Terms

III-Nitride Based Substrate

As long as a III-nitride based substrate 101 enables growth of a III-nitride based semiconductor layer through a growth restrict mask 102, any III-nitride substrate 101 that is sliced on a {1-100}, {20-21}, {20-2-1}, {10-11}, {10-1-1} plane, etc., or other plane, such as from a bulk GaN or AlN crystal, can be used. The bulk GaN substrate off-angle orientation is from the m-plane towards the c-plane at 0 degrees to ±47 degrees.

The III-nitride based substrate 101 and bulk GaN may include Al, In, B, etc.

III-Nitride Based Semiconductor Layers

The III-nitride based semiconductor layers include the ELO III-nitride layer 105, the III-nitride semiconductor device layers 106 and the island-like III-nitride based semiconductor layers 109. These III-nitride-based semiconductor layers can include In, Al and/or B, as well as other impurities, such as Mg, Si, Zn, O, C, H, etc.

The ELO III-nitride layer 105 generally comprises a GaN layer, although other III-nitride layers may be used.

The III-nitride semiconductor device layers 106 generally comprise two or more layers, including at least one layer among an n-type layer, an undoped layer and a p-type layer. The III-nitride semiconductor device layers 106 may comprise one or more GaN layers, AlGaN layers, InGaN layers, AlGaInN layers, etc.

The island-like III-nitride based semiconductor layer 109 are typically formed with sides along an (1-10a) plane (where a is an arbitrary integer), (11-2b) plane (where b is an arbitrary integer), or planes crystallographically equivalent to these, or the sides of the island-like III-nitride semiconductor layers 109 include the (1-10a) plane (where a is an arbitrary integer).

The distance between the island-like III-nitride semiconductor layers 109 adjacent to each other is generally 30 μm or less, and preferably 10 μm or less, but is not limited to these values. The distance between the island-like III-nitride semiconductor layers 109 is preferably the width of a no growth region 104.

As shown FIGS. 4(a) and 4(b), the island-like III-nitride semiconductor layer 109 has short sides 401 and long sides 402, wherein the long sides 402 are perpendicular to the a-axis.

In various embodiments, the island-like III-nitride semiconductor layers 109 may be used to fabricate a light-emitting diode, a laser diode, a Schottky diode, a photodiode, a transistor, etc., but is not limited to these devices. This invention is particularly useful for micro-LEDs and LDs, such as edge-emitting lasers (EELS) and vertical cavity surface-emitting lasers (VCSELs).

The number and placement of electrodes depend on the type of semiconductor device, and typically are disposed at predetermined portions.

Growth Restrict Mask

The growth restrict mask 102 comprises a dielectric layer, such as $SiO_2$, SiN, SiON, $Al_2O_3$, AlN, AlON, MgF, or a refractory metal or precious metal, such as W, Mo, Ta, Nb, Rh, Ir, Ru, Os, Pt, etc. The growth restrict mask 102 may be a laminate structure selected from the above materials. It also can be a multiple-stacking layer structure, which is chosen from the above materials.

In one embodiment, the thickness of the growth restrict mask 102 is about 0.05-3 µm. The width of the mask is preferably larger than 20 µm, and more preferably, the width is larger than 40 µm.

The Effect of Hydrogen Etching

In the present invention, the carrier gas can include Hydrogen gas. The Hydrogen gas has the effect of etching GaN layers or reducing their growth rate. The width of the growth restrict mask 102 affects these effects. A GaN layer is not grown on the growth restrict mask 102, so that area's consumption of Hydrogen for etching the GaN layer is very low.

Therefore, the numbers of Hydrogen atoms that reach the edge of the opening area 103 increase, so that the edge of the opening area 103 is affected by Hydrogen etching strongly. On the other hand, the number of Hydrogen atoms that reach the center of the opening area 103 decreases as compared to the edge.

This effect can be seen in FIG. 5. To simplify, the patterned substrate 101 has a wide open area of about 100 µm. As shown in FIG. 5, the edge area 501 of the opening area 103 is thinner than its center area, which shows the effect of Hydrogen etching.

Figure 6B:
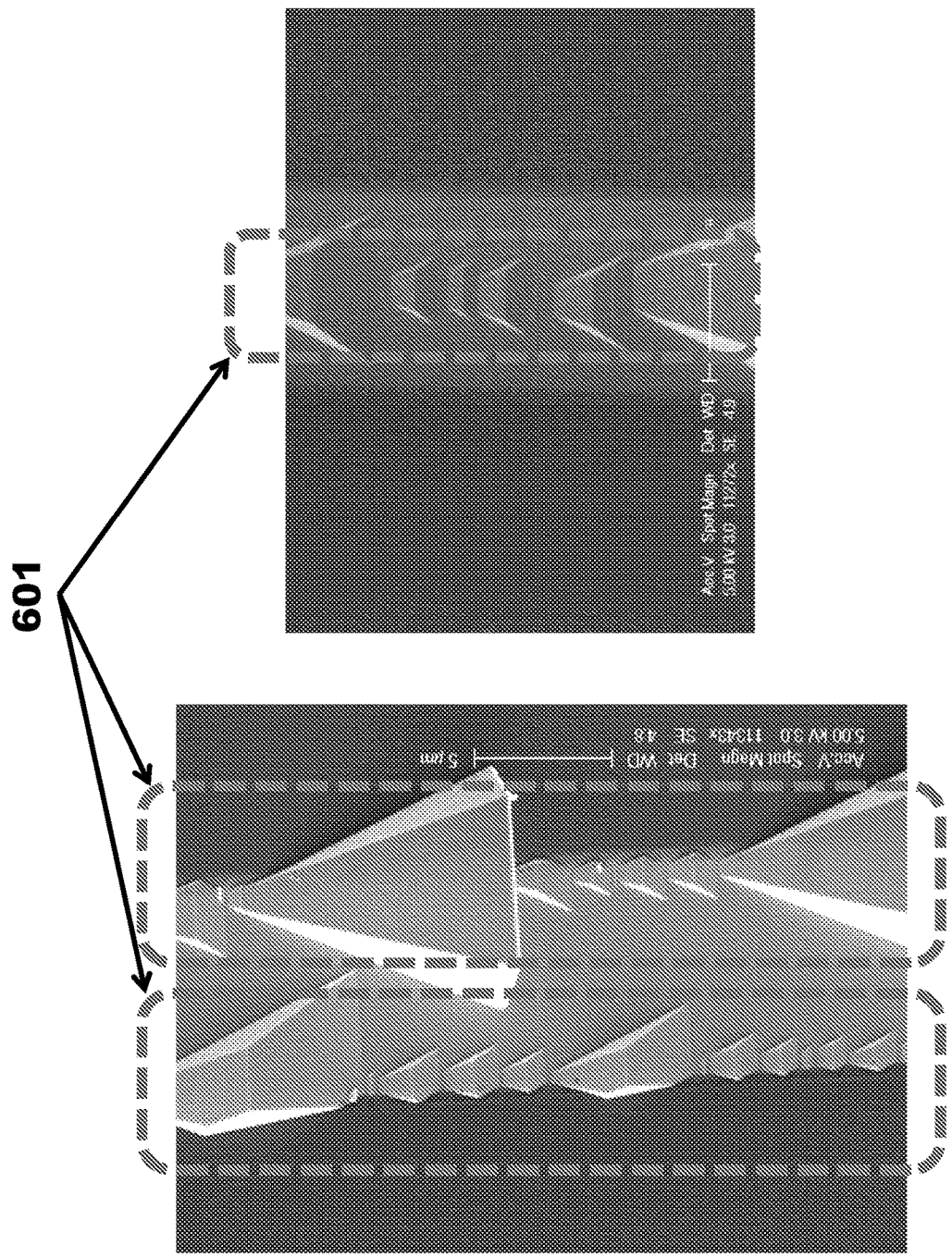
Figure 6C:
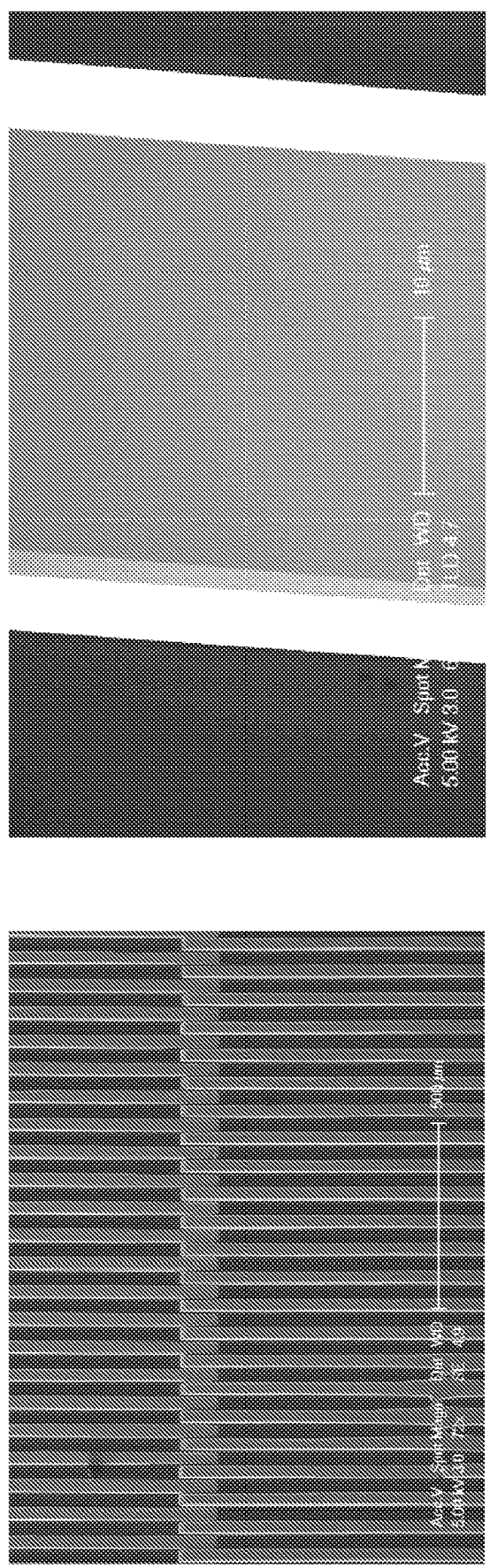

This effect also affects the growth of the layer at the beginning, as shown in FIGS. 6(a)-6(i). For example, as shown in FIG. 6(b), the effect of Hydrogen etching makes the core 601 form at the center of the opening area 103, which avoids forming a depressed region at the center of the ELO III-nitride layer 105.

For the reasons mentioned above, the wider the growth restrict mask 102, the stronger the effects of Hydrogen etching at the edge of the opening area 103. Therefore, the width of the mask 102 is preferably larger than 20 µm, and more preferably, the width is larger than 40 µm. However, the width of the growth restrict mask 102 is preferably under 180 µm, in case there is debris on the growth restrict mask 102.

Furthermore, the width of the opening area 103 is preferably more than 2 µm. If the width of the opening area 103 is less than 2 µm, it is difficult to grow GaN layers at the opening area 103 with a Hydrogen carrier gas condition, due to the effects of Hydrogen etching.

The Direction of the Growth Restrict Mask

Figure 7B:
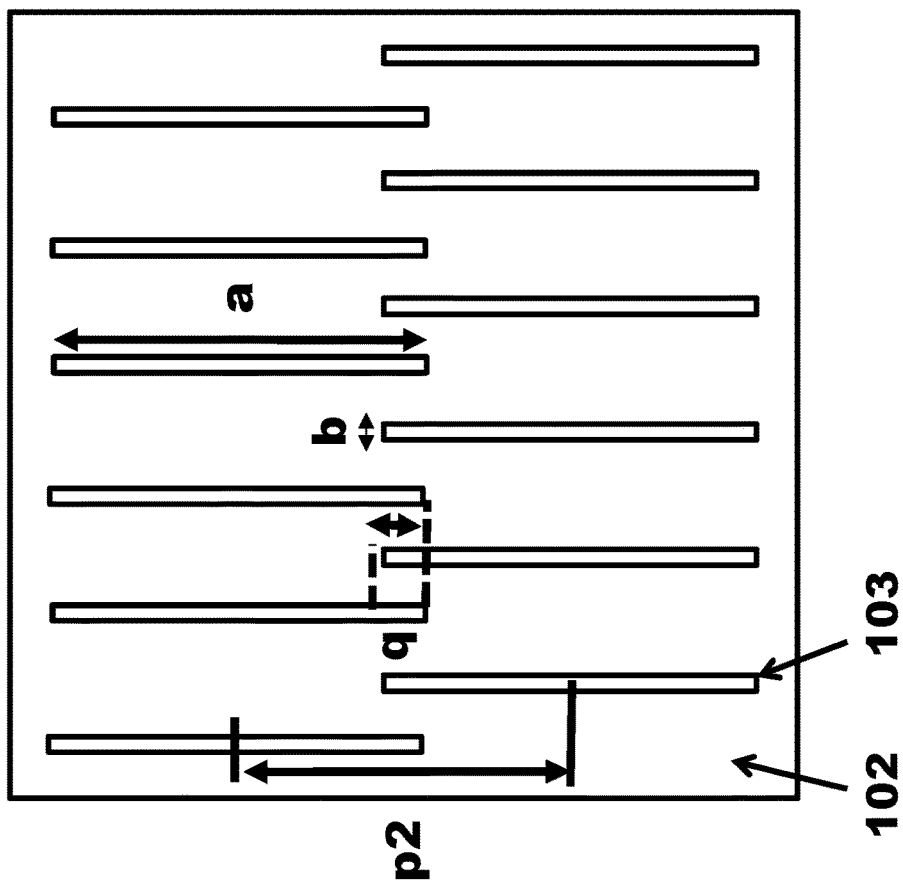
Figure 7A:
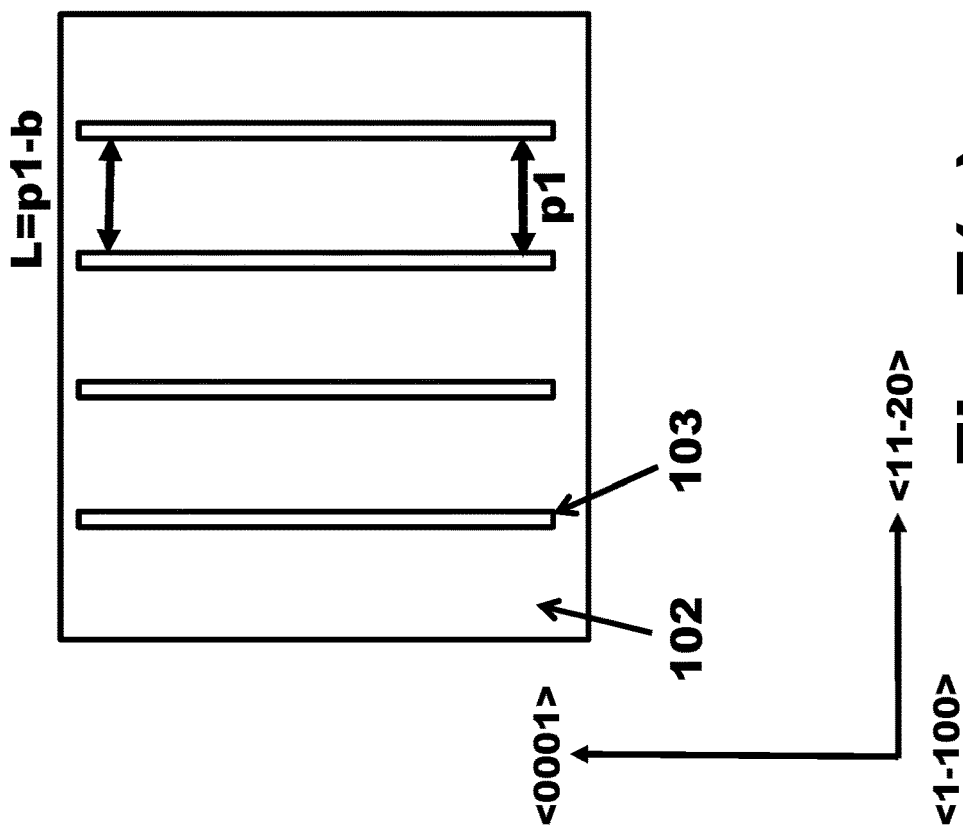

In one example, the growth restrict mask 102 comprises a plurality of striped opening areas 103, shown as 103 in FIGS. 7(a)-7(c). The striped opening areas 103 are arranged in a first direction parallel to the 11-20 direction of the III-nitride based semiconductor layers and a second direction parallel to the 0001 direction of the III-nitride based semiconductor layers, periodically at a first interval and a second interval, respectively, and extend in the second direction.

The width of the striped opening areas 103 is typically constant in the second direction, but may be changed in the second direction as necessary.

The growth restrict mask 102 comprises a plurality of striped opening areas 103 which are arranged in the first direction parallel to the 11-20 direction of the ELO III-nitride layer 105 periodically and extend in the second direction parallel to the 1-100 direction of the ELO III-nitride layer 105; and a plurality of striped opening areas 103 which are arranged periodically in the first direction at the same interval as the striped opening areas 103 and shifted by a half of the interval with respect to the striped opening areas 103 and extend in the second direction in a manner, such that the plurality of striped opening areas 103 overlap with end portions of the striped opening areas 103 for the predetermined distance in the second direction. The width of these striped opening areas 103 is typically constant in the second direction but, as necessary, may be changed in the second direction.

As shown in FIG. 7(c), in this case, the substrate 101 does not have an overlap area. The pitch of c is the distance between islands in the direction parallel to the 1-100 direction. In this case, it is easy to obtain a smooth surface without hillocks.

Flat Surface Region

The flat surface region 107 is between layer bending regions 108. Furthermore, the flat surface region 107 is on the growth restrict mask 102.

Fabrication of the semiconductor device is mainly performed on the flat surface region 107. The width of the flat surface region 107 is preferably at least 5 µm, and more preferably is 10 µm or more. The flat surface region 107 has a high uniformity for the thickness of each semiconductor layer.

Layer Bending Region

Figure 8A:
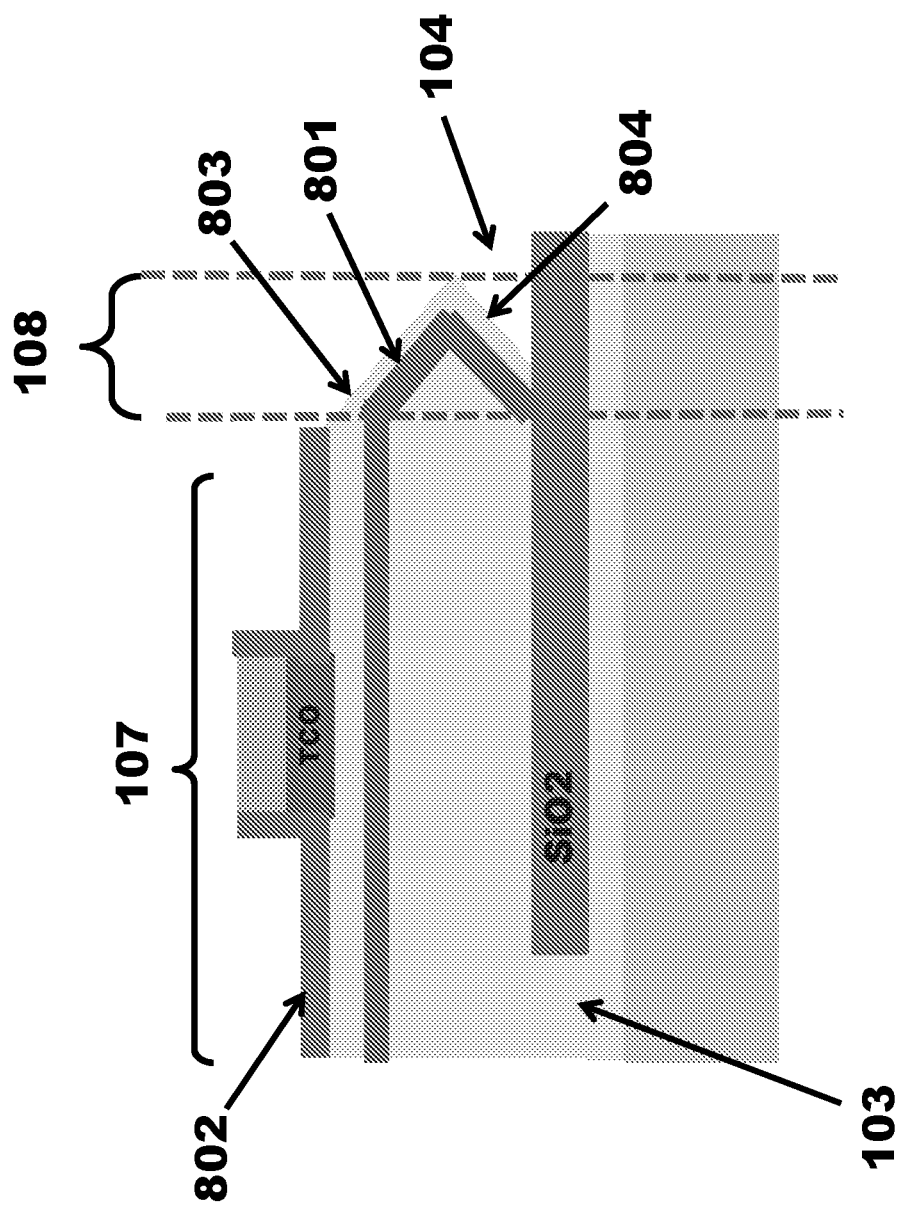
FIGS. 8(a) and 8(b) are schematics illustrating a device structure and its fabrication, according to an embodiment of the present invention.
Figure 8B:
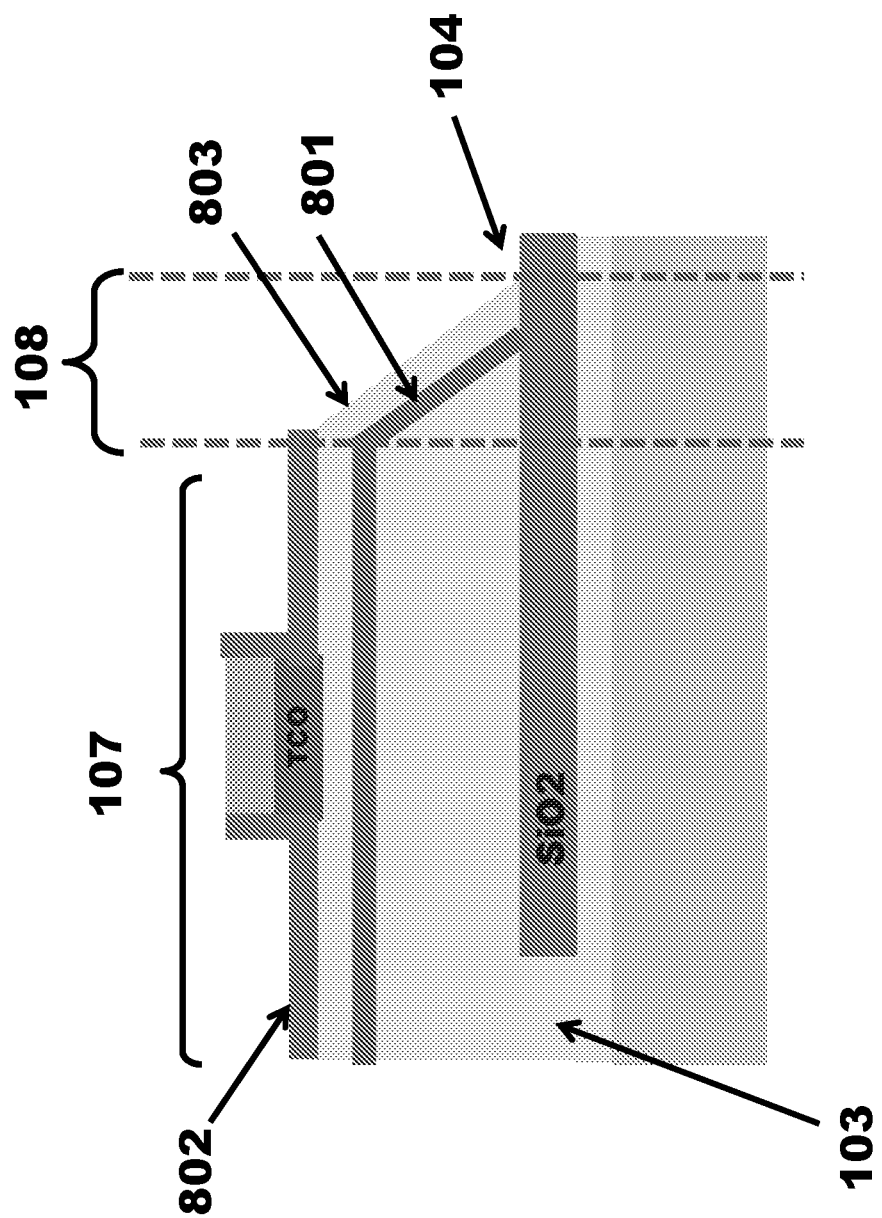

FIGS. 8(a)-8(b) illustrate the layer bending region 108, as well as a bended active region 801 that may remain in the device. The definition of a layer bending region 108 is the region outside of the bended active region 801 including the bended active region 801.

The fabrication of the device may be partially performed on the layer bending region 108. More preferably, the layers at the bending layer region 108 are removed by etching. For example, it is better that at least a part of an active layer in the layer bending region 108 is removed by using an etching process, such as dry etching or wet etching.

If a non-polar or semi-polar substrate 101 is used, the island-like III-nitride semiconductor layers 109 have two or three facets 802, 803, 804 at one side. In the case of three facets, the first facet 802 is a main area to form a ridge structure, while the second facet 803 and third facet 804 are included the layer bending region 108.

If the layer bending region 108 that includes an active layer remains in an LED device, a portion of the emitted light from the active layer is reabsorbed. As a result, it is preferable to remove at least a part of the active layer in the layer bending region 108 by etching.

If the layer bending region 108 that includes an active layer remains in an LD device, the laser mode may be affected by the layer bending region 108 due to a low refractive index (e.g., an InGaN layer). As a result, it is preferable to remove at least a part of the active layer in the layer bending region 108 by etching. More preferably, two etchings may be performed, wherein a first etching removes the active layer in the second facet 803 region before removing the epi-layers from the substrate 101 and a second etching removes the active layers in the third facet 804 region after removing the epi-layers from the substrate 101. If the layer bending region 108 remains in the LD device, the edge of the ridge stripe structure should be at least 1 µm or more from the edge of the layer bending region 108.

The emitting region is a current injection region. In the LD case, the emitting region is a ridge structure. In the LED case, the emitting region is the region where the p-contact electrode is formed. In both the LD and LED cases, the edge of the emitting region should be at least 1 µm or more from the edge of the layer bending region 108 and more preferably 5 µm.

From another point of view, the epitaxial layer of the flat surface region 107, except for the opening area 103, is of a lesser defect density than the epitaxial layer of the opening area 103. Therefore, it is more preferable for the ridge stripe structure to be formed on the flat surface region 107 including its wings.

First and Second Support Substrates

The method for manufacturing the semiconductor device, as necessary, may further comprise a step of bonding a first support substrate to the exposed surface side of the island-like III-nitride semiconductor layers 109 and a first support substrate to the exposed surface side of the III-nitride substrate 101, before peeling the island-like III-nitride semiconductor layers 109 from the III-nitride substrate 101. The first and second support substrates may be comprised of elemental semiconductor, compound semiconductor, metal, alloy, nitride-based ceramics, oxide-based ceramics, diamond, carbon, plastic, etc., and may comprise a single layer structure or a multilayer structure made of these materials. A metal, such as solder, etc., or an organic adhesive, may be used for the bonding of the first and second support substrates, and is selected as necessary.

Support Film

Figure 9:
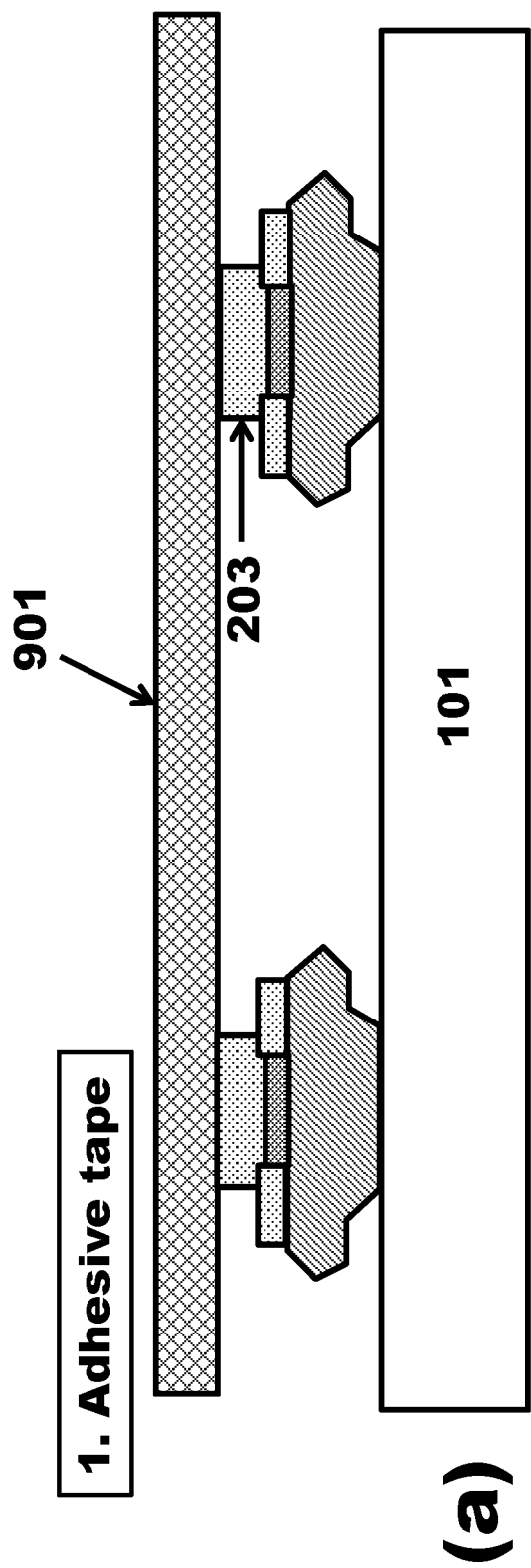
FIGS. 9(a) and 9(b) are schematics illustrating a process of structure removal and FIG. 9(c) is a photograph of the removed structure, according to an embodiment of the present invention.
Figure 9:
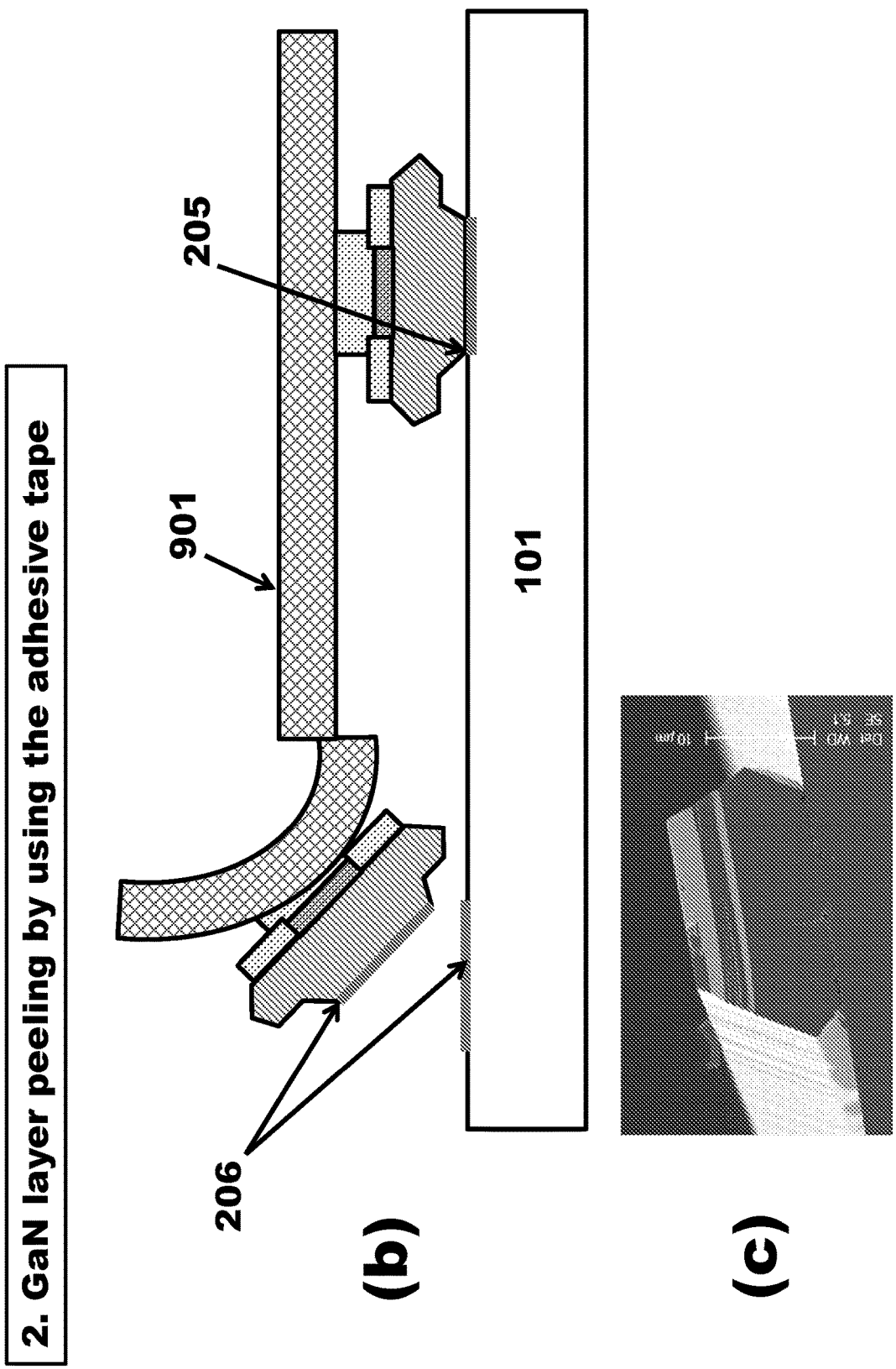

FIGS. 9(*a*)-9(*b*) illustrate the use of a support film 901 in removing devices from the substrate 101. The support film 901 may be an adhesive tape, UV tape, polyimide tape, etc., but is not limited to those materials.

In one embodiment, the support film 901 comprises a layer of polyimide tape (20-50 µm) that is roll-applied to the surface of the metal layer of the p-pad 203. A fracture occurs at the cleaving point 205 upon gently pulling the tape 901 away from the surface of the substrate 101, and along the cleaving surface 206. An image of a device bar removed in this manner is shown in FIG. 9(*c*).

Also, to prevent excessive bending of the thin film after spalling, the outer portions of the tape 901 may be used to secure the sample to a frame.

Fabrication Method

The method of manufacturing the semiconductor device may further comprise a step of forming the growth restrict mask 102 on the III-nitride substrate 101.

For example, m-plane (1-100) freestanding GaN substrates 101 may be used with a growth restrict mask 102 of $SiO_2$. As shown in FIGS. 7(*a*)-7(*c*), opening areas 103 are in the direction parallel to <1-100>. If semi-polar (20-21), (20-2-1) substrates 101 are used, the opening areas 103 are in the direction parallel to [−1014], [10-14,] respectively. The opening areas 103 have a width b, which is 2 µm-180 µm, and more preferably, 4 µm-50 µm, which makes it is easy to obtain to a smooth surface.

Metal-organic chemical vapor deposition (MOCVD) is used for the epitaxial growth. Trimethylgallium (TMGa), trimethylindium (TMIn) and triethylaluminium (TMAl) are used as III elements source. Ammonia ($NH_3$) is used as the raw gas to supply Nitrogen. Hydrogen ($H_2$) and Nitrogen ($N_2$) are used as carrier gas of III elements sources. It is important to include Hydrogen in the carrier gas to obtain a smooth surface for the epi-layer.

Saline and Bis(cyclopentadienyl)magnesium ($Cp_2Mg$) is used as the n-type and p-type dopants. The pressure is setting to be 50 to 760 Torr. The GaN growth temperature ranges from 1050 to 1250° C.

After about 2-8 hours growth time, island-like III-nitride semiconductor layers 109 have the following dimensions:
Thickness: 20-60 µm; and
Bar width: 40-150 µm (where the bar width is the width of the island-like III-nitride semiconductor layers 109).

The method may include bonding the first support substrate to the upper surface side of the III-nitride based semiconductor layers after growing the III-nitride based semiconductor layers upon the substrate 101, and then peeling the first support substrate and the III-nitride based semiconductor layers from the III-nitride based substrate 101.

In addition, the method may further comprise a step of forming one or more electrodes on the surface of the island-like III-nitride semiconductor layer 109 that is exposed after peeling the first support substrate and the island-like III-nitride semiconductor layers 109 from the substrate 101.

As necessary, the method of manufacturing the semiconductor device may further comprise a step of forming one or more electrodes on the upper surface of the island-like III-nitride semiconductor layers 109 after growing the island-like III-nitride semiconductor layers 109 upon the substrate 101. The n-electrodes may be formed after III-nitride based semiconductor layers have been removed using a cleaving technique.

The method may further comprise a step of removing, by wet etchant, at least a portion of, or preferably almost all of, or most preferably all of, the growth restrict mask 102. However, this process is not always necessary to remove the substrate 101. Also as necessary, a conductor thin film or a conductor line may be formed on the major surface of the first support substrate on the side bonded with the III-nitride based semiconductor layers.

According to the present invention, the crystallinity of the island-like III-nitride semiconductor layers 109 laterally growing upon the growth restrict mask 102 from a striped opening area 103 of the growth restrict mask 102 is very high, and III-nitride based semiconductor layers made of high quality semiconductor crystal can be obtained.

Furthermore, two advantages may be obtained using a III-nitride based substrate 101. One advantage is that a high-quality island-like III-nitride semiconductor layer 109 can be obtained, such as with a very low defects density, in comparison to using a sapphire substrate 101. Another advantage, by using a similar or same material for both the epilayer and the substrate 101, is that it can reduce the strain in the epitaxial layer. Also, thanks to a similar or same thermal expansion, the method can reduce the amount of bending of the substrate 101 during epitaxial growth. The effect, as above, is that the production yield can be high in order to improve the uniformity of temperature. But, a hetero-substrate 101 can also be used, such as sapphire(m-plane), $LiAlO_2$, SiC, Si, etc. More preferably, free-standing III-nitride substrates 101 can be used, due to above reasons. If a hetero-substrate 101 is used, it is easy to remove due to weak bonding strength at the cleaving point.

Consequently, the present invention discloses: a substrate 101 comprised of a III-nitride based semiconductor; a growth restrict mask 102 with one or more striped opening areas 103 disposed directly or indirectly upon the substrate 101; and one or more island-like III-nitride semiconductor layers 109 grown upon the substrate 101 using the growth restrict mask 102 in the (1-100) plane orientation, wherein the striped opening areas 103 of the growth restrict mask 102 have long sides and short sides, wherein the long sides are in a direction perpendicular to the a-axis direction of the island-like III-nitride semiconductor layers 109, as shown in FIGS. 7(a), 7(b) and 7(c).

In one embodiment, the growth restrict mask 102 is deposited by sputter or electron beam evaporation or PECVD (plasma-enhanced chemical vapor deposition); but is not limited to those methods.

Also, when a plurality of island-like III-nitride semiconductor layers 109 are grown, these layers 109 are separated each other, that is, is formed in isolation, so tensile stress or compressive stress generated in each island-like III-nitride semiconductor layers 109 is limited within the island-like III-nitride based semiconductor layers 109, and the effect of the tensile stress or compressive stress does not fall upon the other III-nitride based semiconductor layers.

Also, as the growth restrict mask 102 and the ELO III-nitride layer 105 are not bonded chemically, the stress in the ELO III-nitride layer 105 can be relaxed by a slide caused at the interface between the growth restrict mask 102 and the ELO III-nitride layer 105.

Also, the existence of gaps between each of the island-like III-nitride semiconductor layers 109, as shown by the no-growth region 104 in FIGS. 1 and 4(a)-4(b), results in the substrate 101 having rows of a plurality of island-like III-nitride semiconductor layers 109, which has flexibility, and therefore, is easily deformed when external force is applied and can be bended.

Therefore, even if a slight warpage, curvature, or deformation occurs in the substrate 101, this can be easily corrected by a small external force, to avoid the occurrence of cracks. As a result, the handling of substrates 101 by vacuum chucking is possible, which makes the manufacturing process of the semiconductor devices more easily carried out.

As explained, island-like III-nitride semiconductor layers 109 made of high quality semiconductor crystal can be grown by suppressing the curvature of the substrate 101, and further, even when the III-nitride based semiconductor layer is very thick, the occurrences of cracks, etc., can be suppressed, and thereby a large area semiconductor device can be easily realized.

First Embodiment

A III-nitride based semiconductor device and a method for manufacturing thereof according to a first embodiment are explained.

In the first embodiment, the substrate 101 is first provided, and the growth restrict mask 102 that has a plurality of striped opening areas 103 is formed on the substrate 101. In this embodiment, the substrate 101 is made of a III-nitride semiconductor, such as GaN.

Figure 6D:
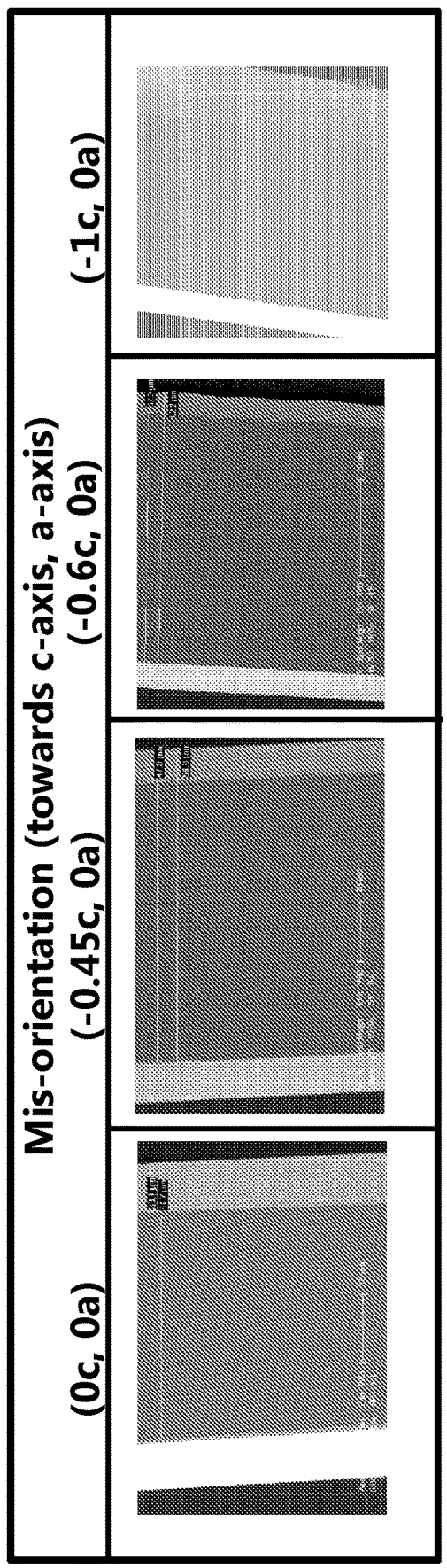
Figure 6E:
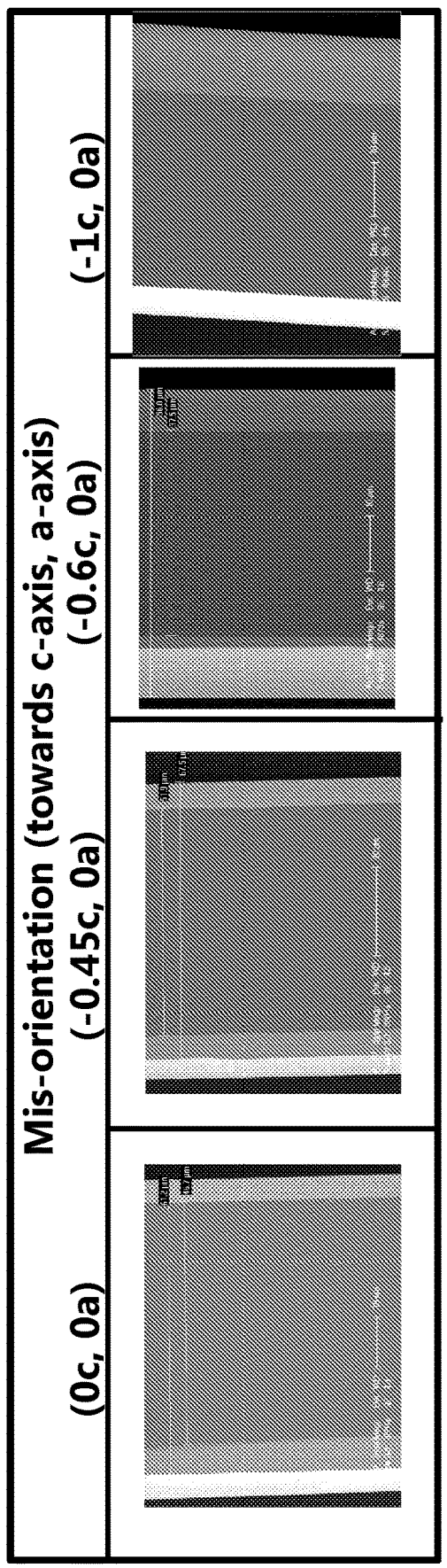
Figure 6F:
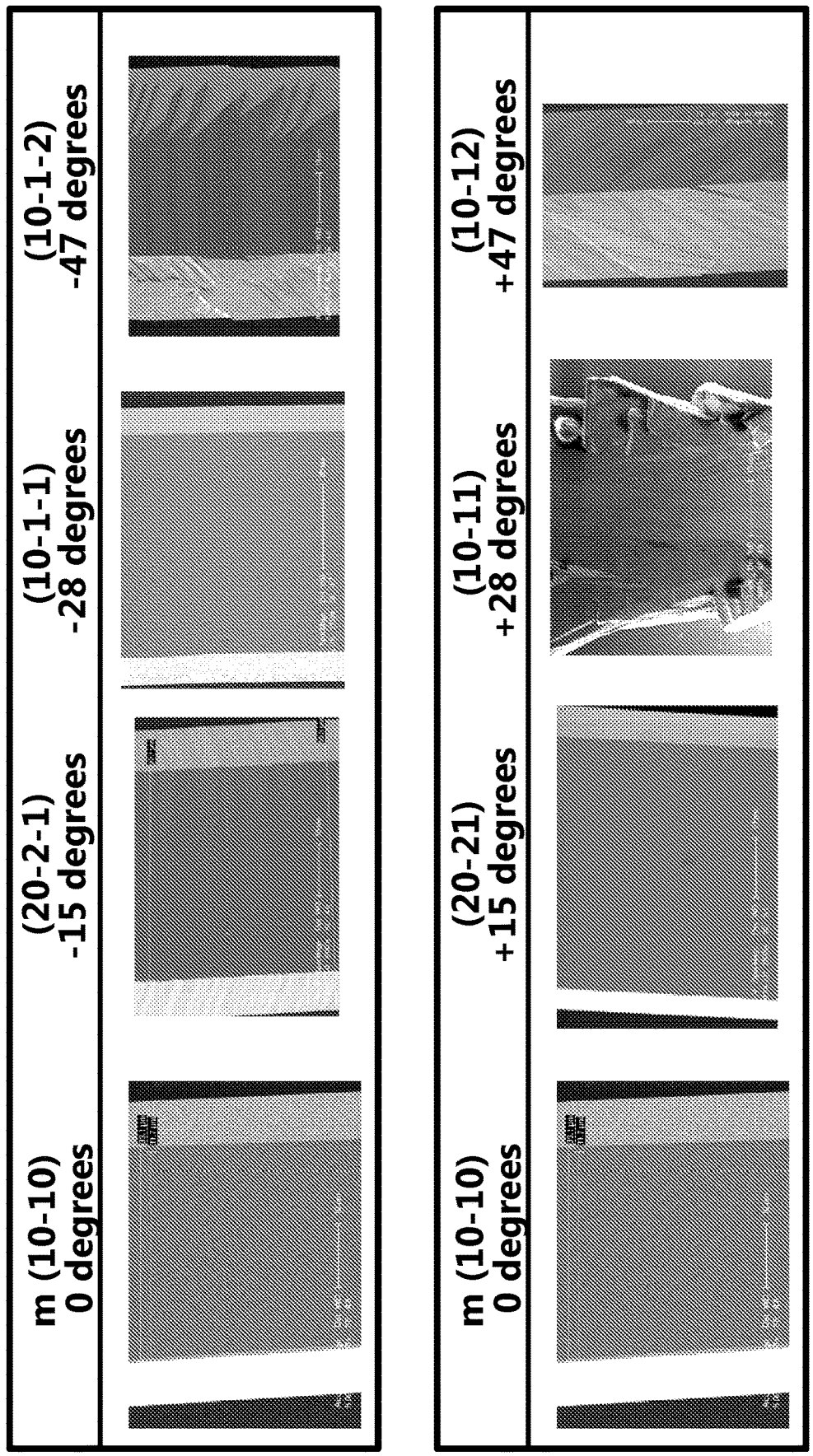
Figure 6G:
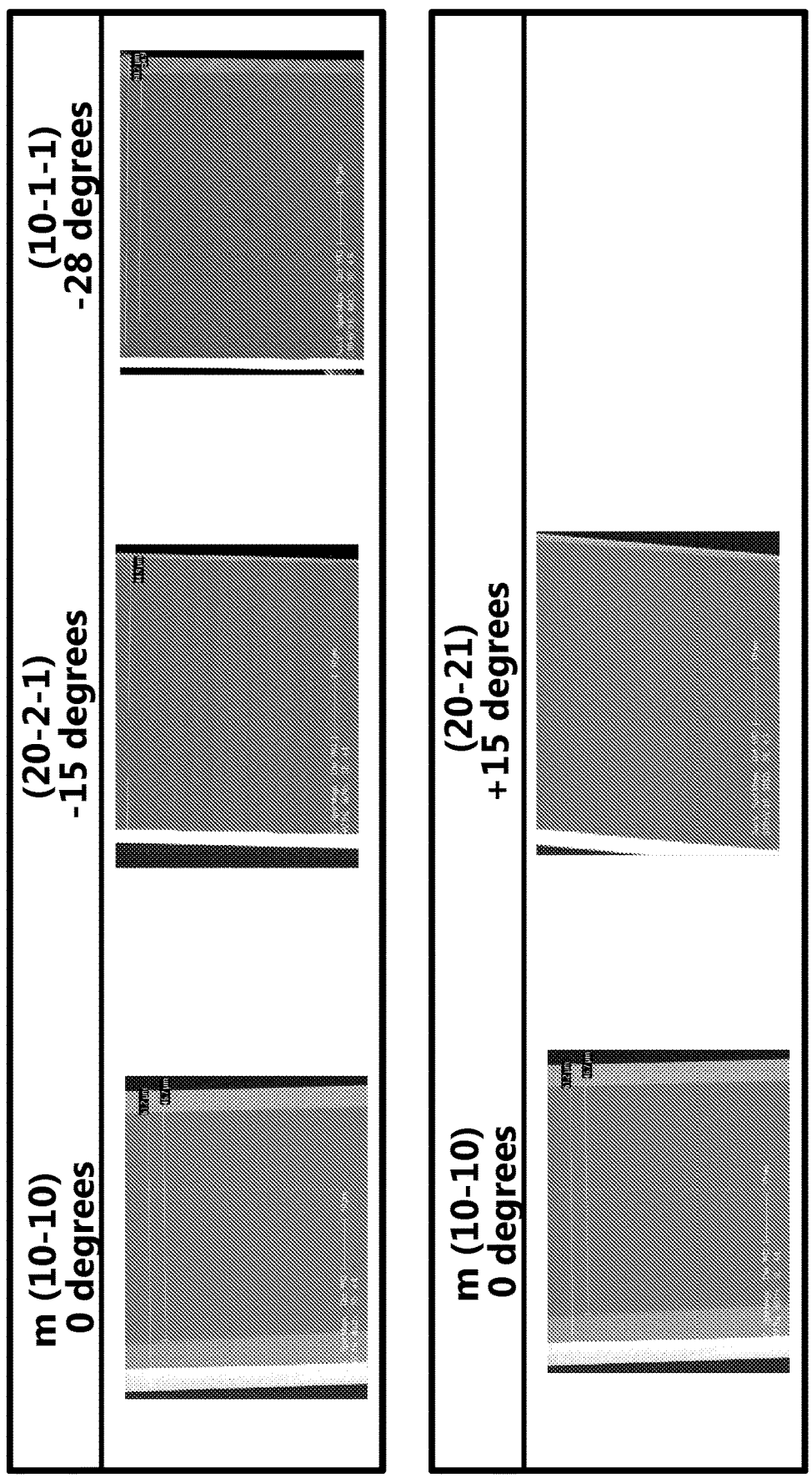
Figure 6H:
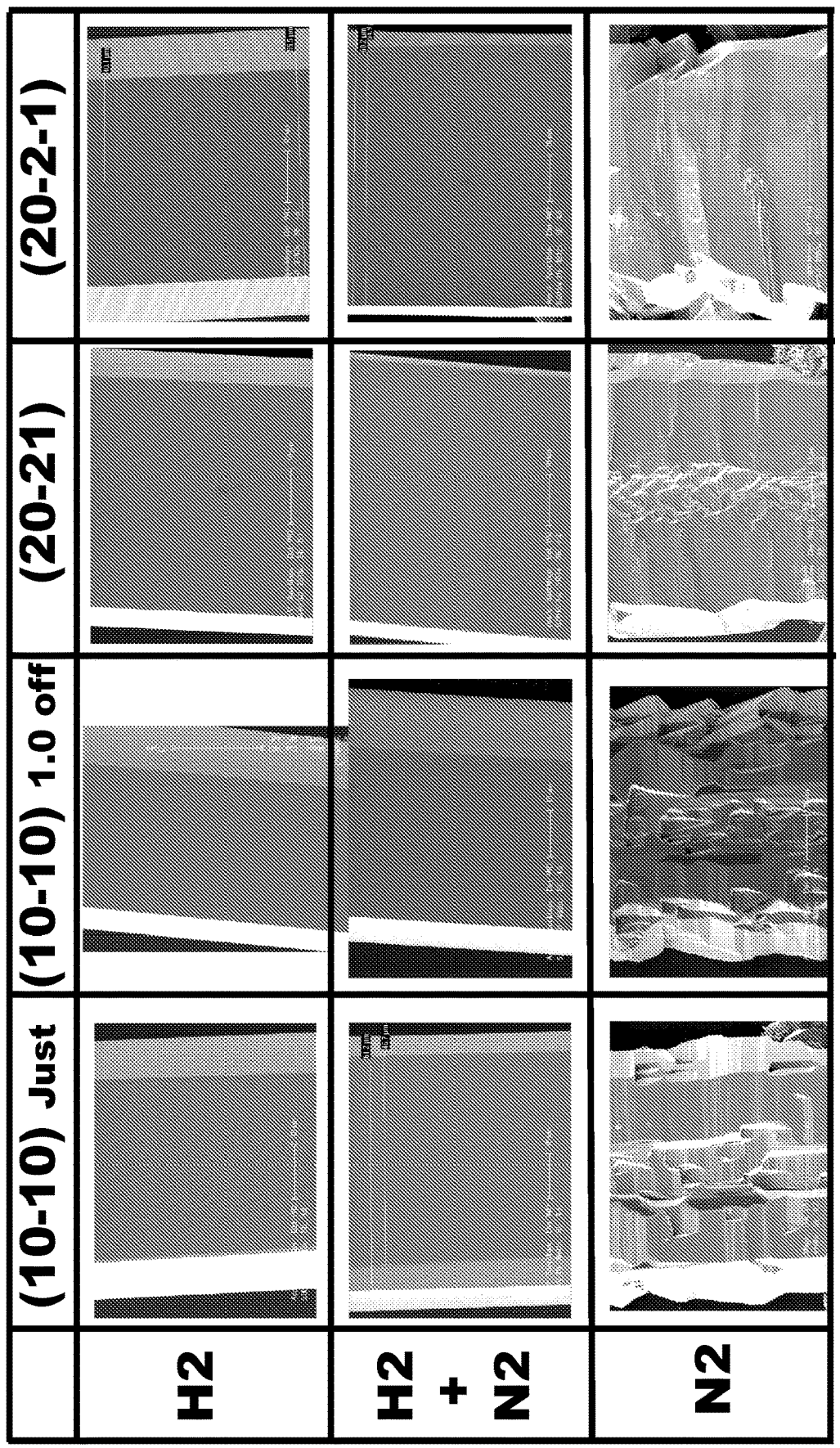
Figure 6I:
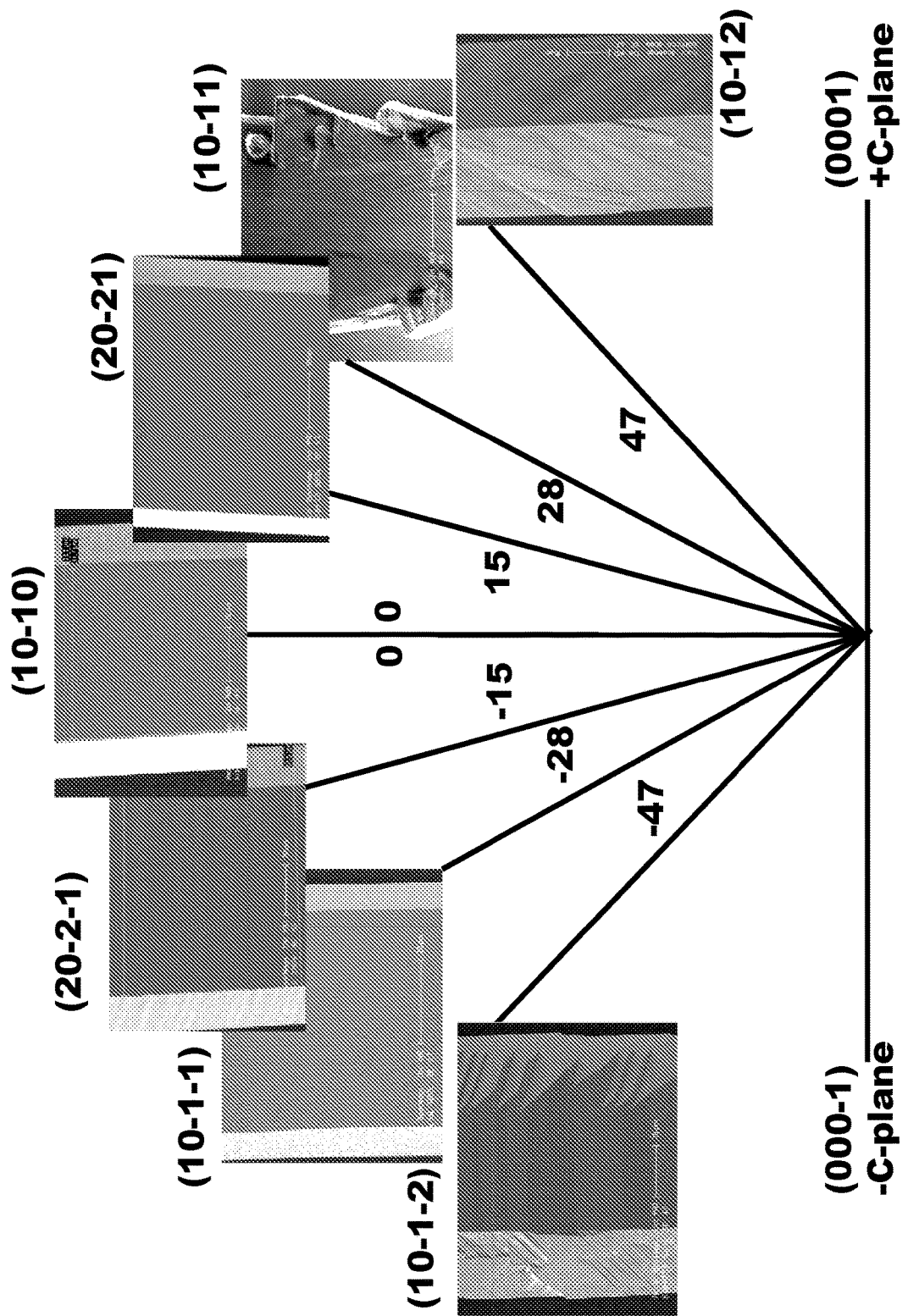

Some substrates 101 may be prepared with a different off-angle orientation. FIG. 6(d) has four SEM (Scanning Electron Microscopy) images of the surface of the island-like III-nitride semiconductor layer 109 on substrates 101 with different off-angle orientations, labeled as mis-orientations "(towards c-axis, a-axis)," where the carrier gas is $H_2$. The off-angle orientations range up to −1 degrees from the m-plane towards the c-axis (i.e., c-plane), and 0 degrees (i.e., less than 0.02 degrees) towards the a-axis (i.e., a-plane). In this embodiment, the substrate 101 has a just-orientation of less than 0.2 degrees.

Making a Patterned Substrate

The thickness of the III-nitride based semiconductor layers to be grown upon the GaN substrates is about 5 to 80 μm, for example, but is not limited to these values. As described herein, the thickness of the III-nitride based semiconductor layers is measured from the surface of growth restrict mask 102 to the upper surface of the III-nitride based semiconductor layers.

The growth restrict mask 102 can be formed from an insulator film, for example, an $SiO_2$ film deposited upon the substrate 101 by plasma chemical vapor deposition (CVD), sputtering, ion beam deposition (IBD), etc., wherein the $SiO_2$ film is then patterned by photolithography using a predetermined photo mask and etching. The thickness of the $SiO_2$ film in this embodiment is 0.3 μm, but is not limited to that value.

Using the growth restrict mask 102, the ELO III-nitride layer 105 is grown in an island-like shape in the (1-100) plane orientation by a vapor-phase deposition method, for example, a metalorganic chemical vapor deposition (MOCVD) method. In this case, the surface of the substrate 101 is exposed in the opening areas 103, and the ELO III-nitride layer 105 is selectively grown thereon, and is continuously laterally grown upon the growth restrict mask 102. The growth is stopped before the ELO III-nitride layer 105 coalesces with an adjacent ELO III-nitride layer 105.

The thickness of ELO III-nitride layer 105 is important, because it determines the width of the flat surface region 107. Preferably, the width of the flat surface region 107 is 20 μm or more.

The thickness of ELO III-nitride layer 105 is preferably as thin as possible. This is to reduce the process time and to etch the opening area 103 easily.

The growth ratio of ELO is the ratio of the growth rate of the lateral direction parallel to the 11-20 axis of the GaN substrate 101 to the growth rate of the vertical direction parallel to the 1-100 axis of the GaN substrate 101. The ratio of ELO is preferably high, wherein the ratio of ELO=lateral growth rate/vertical growth rate. Optimizing the growth conditions, the ratio of ELO can be controlled from 0.4 to 4.

Next, the III-nitride device layers 106 are grown on the ELO III-nitride layer 105. The III-nitride device layers 106 are comprised of a plurality of III-nitride-based layers.

Growth Restrict Mask

The growth restrict mask 102 is disposed directly upon a substrate 101 that comprises a III-nitride based semiconductor. Specifically, the growth restrict mask 102 is disposed directly in contact, or is disposed indirectly through an intermediate layer grown by MOCVD or sputter, etc., made of a III-nitride based semiconductor. Two examples of the growth restrict mask 102 are shown in FIGS. 7(a) and 7(b).

The growth restrict mask 102 shown in FIG. 7(a) comprises a plurality of opening areas 103, which are arranged in a first direction parallel to the 11-20 direction of the (1-100) plane-oriented III-nitride semiconductor substrate 101 and a second direction parallel to the 0001 direction of the III-nitride semiconductor substrate 101, periodically at intervals p1 and p2, respectively, extending in the second direction. Each of a pair of the opening areas 103 are adjacent to each other in the second direction for the length q, respectively. The length a of the opening area 103 is, for example, 200 to 3500 μm; the width b is, for example, 2 to 180 μm; the interval p1 of the opening areas 103 is, for example, 20 to 180 μm; and the interval p2 is, for example, 200 to 2000 μm.

The island-like III-nitride semiconductor layers 109 have long sides and short sides. Preferably, the long sides are perpendicular to the a-axis direction. In this case, as shown in the rightmost image of FIG. 6(b), the cores 601 of the epi-layer are aligned along perpendicular to the a-axis direction at the center of the opening area 103. By doing this, it can control the beginning of growth, so that it is easy to obtain a smooth surface in the flat surface, region 107 of the ELO III-nitride layer 105.

Typical Dimensions of the Growth Restrict Mask

Typically, the growth restrict mask 102 used in the present invention has dimensions as follows. In one embodiment, an m-plane GaN-substrate 101 is used. The growth restrict mask 102 is formed as shown in FIG. 7(c) with a 0.3 µm thick SiO$_2$ film, wherein the length a of the opening area 103 is 1200 µm; the width b is 20 µm; the interval p1 of the opening area 103 is 80 µm; the interval p2 is 1300 µm; the width of the mask 102 stripes between opening areas 103 is 60 µm; and the distance between the opening area 103 and the opening area 103 in the 1-100 direction is 100 µm.

Opening Areas of the Growth Restrict Mask

The growth restrict mask 102 shown in FIG. 7(b) comprises a plurality of opening areas 103, which are arranged in a first direction parallel to the 11-20 direction of the (1-100) plane-oriented III-nitride semiconductor substrate 101 periodically with the interval p1 and extend in a second direction parallel to the 0001 direction of the III-nitride semiconductor substrate 101. To prevent embossment of both end portions in the 0001 direction of the III-nitride semiconductor substrate 101 as described later, the growth restrict mask 102 further comprises a plurality of opening areas 103, which are arranged periodically in the first direction at the same interval p1 as the opening window 103, shifted by a half of the interval p1 with respect to the opening area 103, and extend in the second direction in a manner such that the plurality of opening areas 103 overlap with the end portions of the opening areas 103 for the length q in the second direction.

The length a of the opening area 103 is, for example, 200 to 3500 µm; the width b is, for example, 4 to 60 µm; the interval p1 of the opening area 103 is, for example, 20 to 120 µm; the width of the mask 102 stripes L is, for example, p1−b, so, in case of p1=55 µm and b=5 µm, L is 50 µm; and the overlapping length r of the end portions each other of the opening areas 103 is 35 to 40 µm.

Advantages the Opening Areas

Growing the ELO III-nitride layer 105 and island-like III-nitride semiconductor layers 109 using the growth restrict mask 102 shown in FIG. 1 provides many advantages.

In the growth restrict mask 102 shown in FIGS. 4 and 7, as the longitudinal direction of the opening area 103 is in the 0001 direction, the growth rate of the III-nitride based semiconductor is low at the both ends of the opening area 103, the island-like III-nitride semiconductor layers 109 opposing each other in the 0001 direction do not coalesce, and the island-like III-nitride semiconductor layers 109 can be separated from each other. At this time, the size of the island-like III-nitride semiconductor layer 109 in the 0001 direction becomes nearly equal with the length a of the opening area 103.

In the island-like III-nitride semiconductor layer 109 enclosed with planes, including planes with a low growth rate, when the distance is large between the adjacent III-nitride semiconductor layers 109 in opposing planes with a low growth rate, the following disadvantages occur. That is, in the stripes of the growth restrict mask 102 between adjacent island-like III-nitride semiconductor layers 109, as the raw gas is not consumed there, the gas concentration goes up, and the concentration gradient is generated in the direction joining the adjacent III-nitride semiconductor layers 109, and by the diffusion according to the concentration gradient, a lot of the raw gas is supplied at the edge portions of the island-like III-nitride semiconductor layers 109. As the result, the thickness of the edge portions of the island-like III-nitride based semiconductor layers 109 becomes larger in comparison with other portions, and becomes a raised shape. More specifically, at the stripes of the growth restrict mask 102 between the adjacent island-like III-nitride based semiconductor layers 109 in the 0001 direction of which the growth rate is smaller, the raw gas is not consumed there, and therefore, the gas concentration goes up, and the concentration gradient in the 0001 direction is generated, and by the diffusion according to the concentration gradient, a lot of the raw gas is supplied at the edge portions in the 0001 direction of the island-like III-nitride semiconductor layers 109. As the result, the thickness of the edge portions in the 0001 direction of the island-like III-nitride semiconductor layers 109 becomes larger in comparison with other portions, and becomes a raised shape. The specific raised shape of the edge portions of the island-like III-nitride semiconductor layers 109 causes not only structural inconveniences in the III-nitride based semiconductor device, but also creates problems in the following manufacturing processes of photolithography, etc.

To prevent uniformity of the thickness of the island-like III-nitride semiconductor layer 109 caused by a specific raised shape of the edge portion, the adjacent island-like III-nitride semiconductor layers 109 come as close as possible, and it is necessary not to create in-plane uniformity of the raw gas from the beginning of the growth. For this, in the growth restrict mask 102 shown in FIG. 7(b), upon the bisecting line of the region between a pair of opening areas 103 adjacent to each other in the 11-20 direction, is formed in a manner such that the opening area 103 overlaps with the opposing end portions of the opening area 103 adjacent to each other in the 0001 directions for the length q, respectively.

As a result, in-plane uniformity of gas concentration can be obtained by the consumption of the raw gas caused by growing the island-like III-nitride semiconductor layers 109. Finally, a uniformity in the thickness of the island-like III-nitride semiconductor layers 109 can be obtained.

Growth Conditions of the ELO III-Nitride Layer

The growth conditions of the island-like III-nitride semiconductor layer 109 can be the same MOCVD growth conditions as the ELO III-nitride layers 105. For example, the growth of the GaN layer is at a temperature of 930-1200° C. and a pressure of 15 kPa. For the growth of a GaN layer, trimethylgallium (TMG) and ammonia (NH$_3$) are used as the raw gas, and the carrier gas is only Hydrogen (H$_2$), with silane (SiH4) as a dopant gas. The growth time is 4 hours.

The growth gas flow rate is following; TMG is 12 sccm, NH$_3$ is 8 slm, carrier gas is 3 slm, and SiH$_4$ is 1.0 sccm. The V/III ratio is about 7700. Then, it can obtain a 20 µm thick ELO III-nitride layer 105.

Effects of Isolation of a Region from Growth

Also, as shown in FIGS. 4(a)-4(b), the III-nitride based semiconductor layers are isolated from the edge of the substrate 101.

Figure 10A:
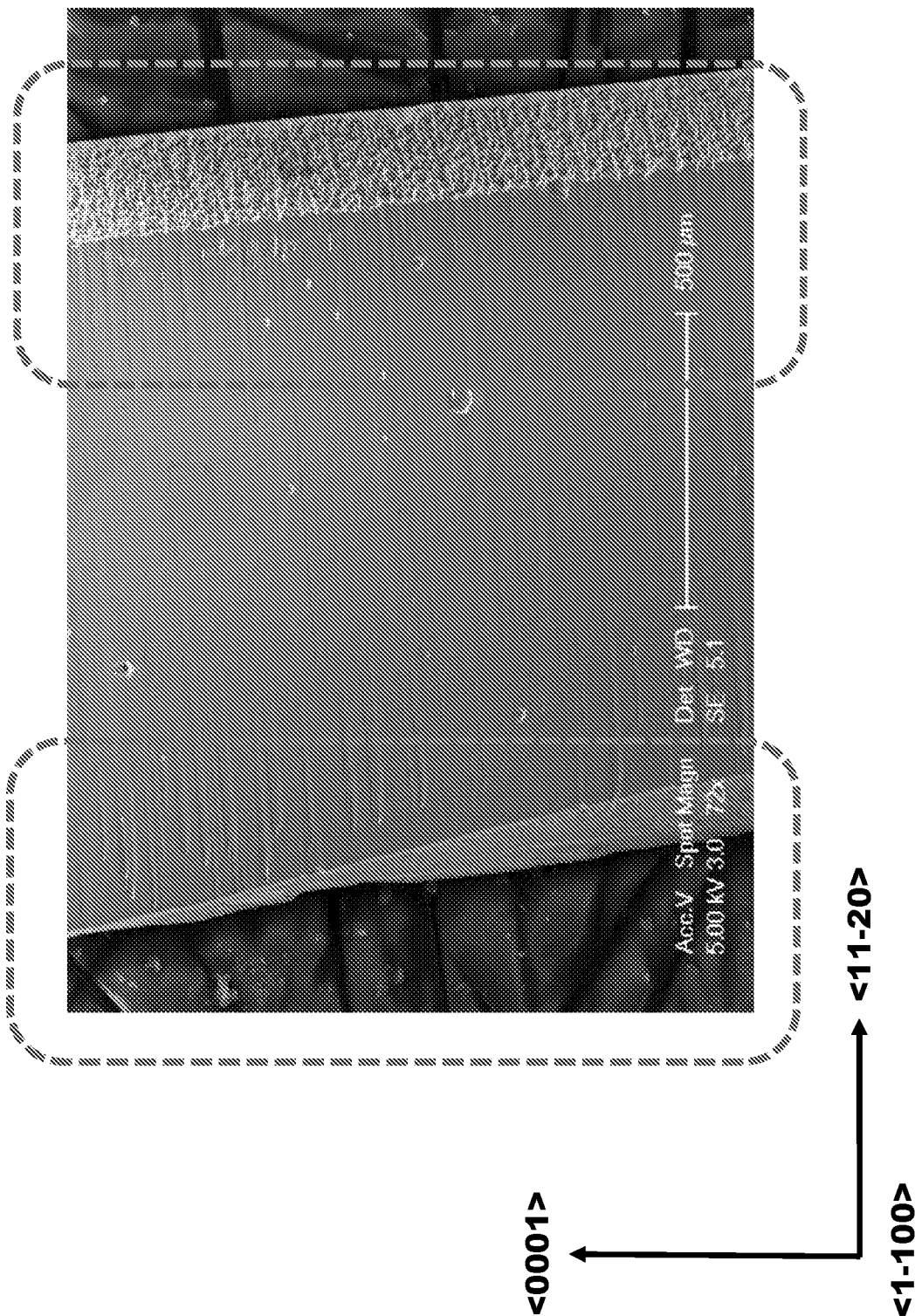
FIGS. 10(a), 10(b), 10(c) and 10(d) are photographs illustrating experimental results, according to an embodiment of the present invention.
Figure 10B:
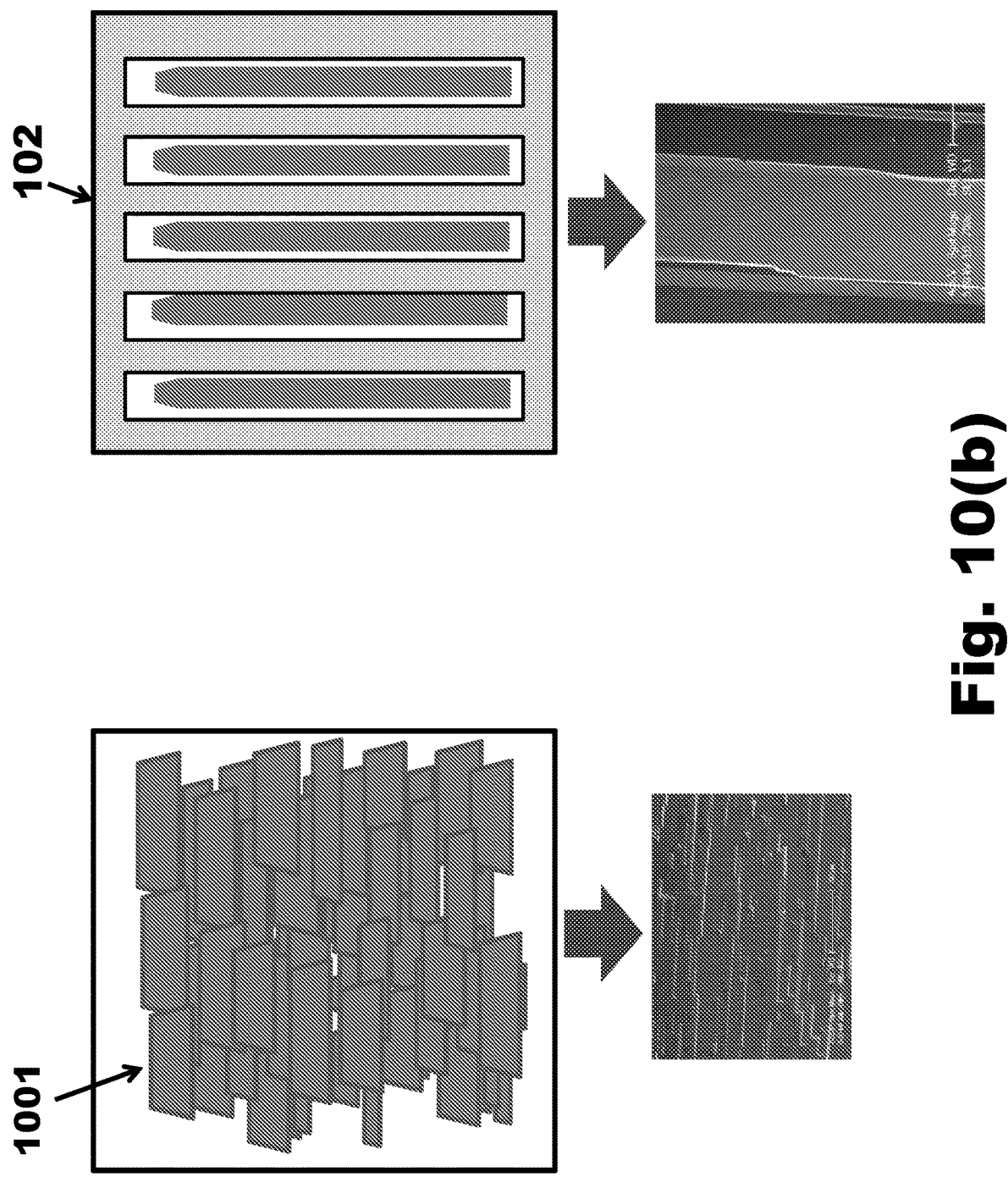
Figure 10C:
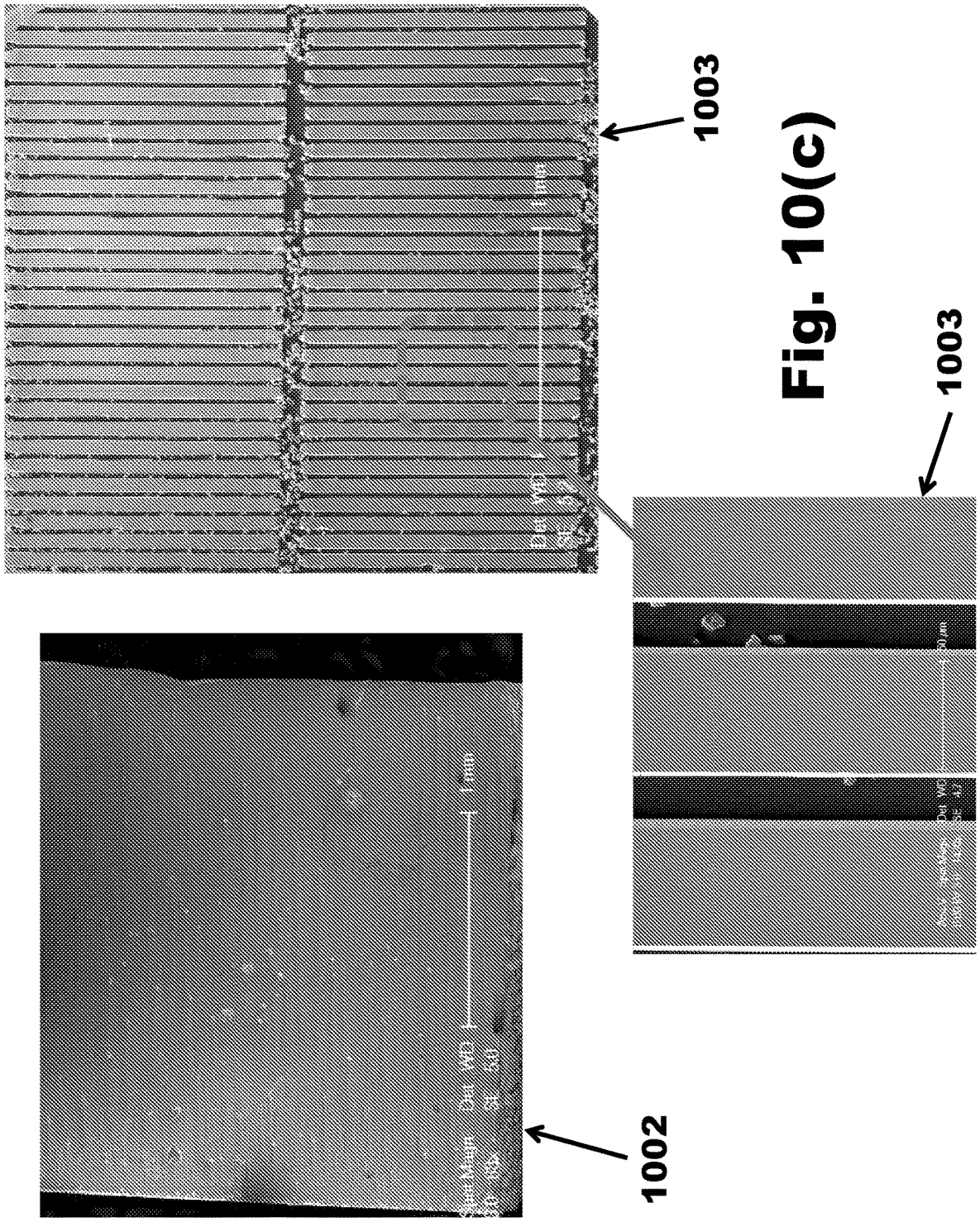
Figure 10D:
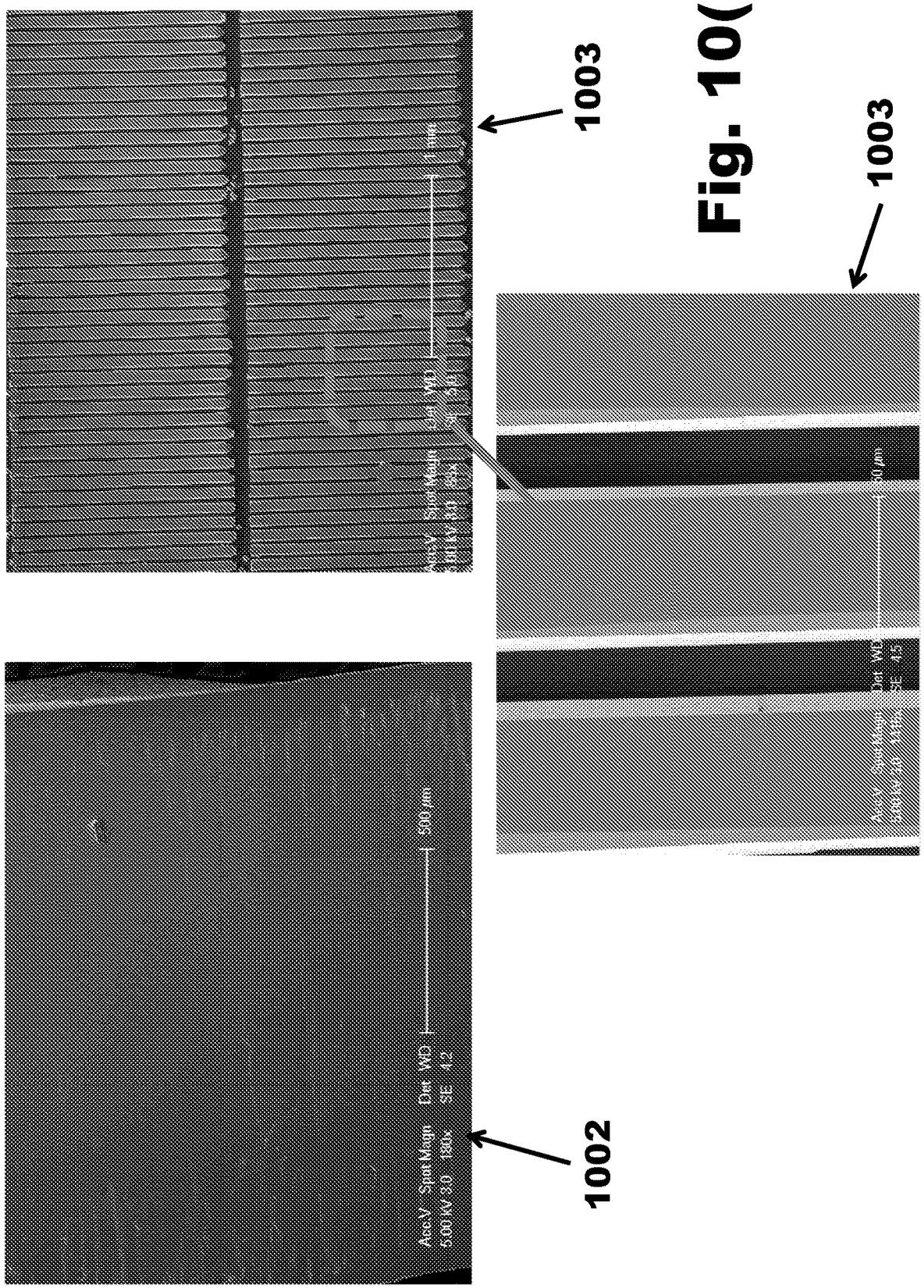

FIG. 10(a) is a photograph of a GaN layer on a semi-polar (20-21) substrate without a pattern, wherein the shapes of the edges of the substrate 101, which are enclosed by dashed lines, are not uniform. Consequently, the growth rate and the shape of the core is unstable, so that the edge region of the substrate 101 has a rough surface.

A non-polar III-nitride substrate 101, such as an m-plane III-nitride substrate 101, has similar results. As shown in the two images on the left side of FIG. 10(*b*), there are a lot of cores 1001 of random shape on the substrate 101 with no pattern, which results in a large amount of surface roughness. On the other hand, there is a smooth surface on the substrate 101 patterned with a growth restrict mask 102 of SiO$_2$ 102, due to the isolated areas, as shown in the two images on the right side of FIG. 10(*b*).

At least the opening area 103 should be isolated from the facets of the substrate 101, which are enclosed by dashed lines in FIG. 10(*a*). These facets are perpendicular to the a-axis. Preferably, the opening area 103 is isolated from the facets that are perpendicular from the projected c-axis.

Consequently, to obtain a smooth surface in the flat surface region 107, the III-nitride based semiconductor layers should be isolated from the edge of substrate 101.

Other examples are shown in the imams of FIGS. 10(*c*)-10(*d*), wherein the substrate of FIG. 10(*c*) is (10-1-1) and the substrate of FIG. 10(*d*) is (1-100) without an off-angle orientation. Both FIGS. 10(*c*) and 10(*d*) include images of substrates 101 that are not patterned 1002 and patterned 1003, that were grown with MOCVD at the same time. The surface morphology of the substrates 101 that are not patterned 1002 is rough, with non-uniform edges and pits on the surface. On the other hand, the substrates 101 that are patterned 1003 have a very smooth surface. The enlarged portions of the substrates 101 that are patterned 1003 show some debris on the growth restrict mask 102, but the surface of the ELO III-nitride layer 105 is very smooth. Moreover, the debris disappears when the growth conditions are optimized. Generally, a (10-1-1) plane is likely to obtain a rough surface, but the use of a substrate 101 that is patterned 1003 can result in a smooth surface.

Different Carrier Gas Conditions

To compare the effects depending on carrier gas, two samples have been grown with a Hydrogen carrier gas condition and a Nitrogen carrier gas condition.

As shown in the three images of FIG. 6(*a*), which reflect growth on the (1-100), (20-21) and (20-2-1) planes, the Nitrogen carrier gas condition results in a depressed region on the surface at the center of ELO III-nitride layer 105. As mentioned above, the reason is the lack of Hydrogen etching at the edges of the opening area 103.

As shown in the two images of FIG. 6(*c*), the Hydrogen carrier gas condition does not have the same problem.

As shown in the two images of FIG. 6(*b*), the cores 601 made at the beginning of the growth are formed at the center of the opening region 103. This growth has avoided coalescing the cores 601 at the center, so that the depressed region has disappeared from the ELO III-nitride layer 105.

FIGS. 6(*a*), 6(*b*) and 6(*c*) are results in the case where the width of the opening area 103 is 8-9 μm.

On the other hand, the twelve images of FIG. 6(*h*) show the results in the cases where the width of the opening area 103 is 25 μm. In these cases also, using a Hydrogen carrier gas, alone or in combination with a Nitrogen carrier gas, resulted in a smooth surface, but using a Nitrogen carrier gas case alone resulted in the surfaces having a large amount of surface roughness without flat areas.

Furthermore, the region of growth has been isolated from the edge of the substrate 101, which keeps hillocks from appearing on the surface.

Different Off-Angle Orientations

Different off-angle orientations of the substrate 101 have been prepared, along with a just-orientation. The off-angle orientations are of an m-plane oriented crystalline surface plane, wherein the off-angle orientations range from about +47 degrees to about −47 degrees towards a c-plane. ELO III-nitride layers 105 were grown on those substrates 101, with the Hydrogen carrier gas condition, at the same time.

FIG. 6(*d*) includes four images of the surface of the ELO III-nitride layer 105, where the angle of the substrates 101, from left to right, is 0, −0.45, −0.6 and −1 degrees from the m-plane towards the (0001) c-plane. It would be expected that these off-angle orientations would affect surface morphology, which would be the case when using a substrate 101 with no pattern. Some substrates 101 would have pyramidal hillocks, wavy surfaces, etc.

However, as shown in FIG. 6(*d*), every sample has a good surface morphology at the same time, even with different off-angle orientations. In m-plane growth, such results have not been reported before.

Furthermore, as shown in the eight images of FIG. 6(*f*), smooth surfaces can be realized with the same technique on substrates 101 with different planes, such as (10-10), (20-2-1), (10-1-1), (10-1-2), (20-21), (10-11) and (10-12), that are on-axis (0 degrees off-angle orientation) or mis-oriented (−15, −28, −47, +15, +28, +47 degrees off-angle orientation), using only H$_2$ carrier gas.

These samples have a very smooth surface. The (10-1-2) and (10-11) planes have a surface that is a little bit rough, but a part of the surface shows a flat area. An optimization of the growth conditions, such as the ratio of Hydrogen and Nitrogen of the carrier gas, V/III ratio, and growth temperature and so on, would improve the surface roughness. Therefore, the present invention can also adopt these planes. On the other hand, the (10-12) plane has a triangular shape without a flat area.

As shown in the images of FIG. 6(*i*), the present invention can adopt these substrates 101 which have an off angle orientation ranging from −47 degrees to +28 degrees from the m-plane towards the c-plane. More preferably, the off-angle orientation ranges from −28 degrees to +15 degrees from the m-plane towards the c-plane.

In addition, growth may be performed with a mixed gas condition using a Hydrogen and Nitrogen carrier gas. Both gas flows are 1.5 slm and total carrier gas flow is 3.0 slm.

The results using an H$_2$ and N$_2$ mixed carrier gas are shown in the images of FIG. 6(*g*), as well as FIG. 6(*e*). In these cases, substantially the same results are obtained for the (10-10), (20-2-1), (10-1-1), (10-10), and (20-21) surfaces, at 0, −15, −28, 0 and +15 degrees, respectively. Thus, including Hydrogen in the carrier gas is important for obtaining a smooth surface.

Consequently, a very smooth surface can be obtained, even though a different off-angle orientation and plane is used. This is especially true for off-angles under 0.6 degrees, where it has been difficult to obtain smooth surfaces. However, even for off-angles under 0.6 degrees, it is possible to obtain a smooth surface using the present invention.

Generally, a GaN substrate 101 has a large in-plane distribution of off-angle orientations. Previously, though, the large in-plane distribution on off-angle orientations resulted in a decreasing yield due to rough surfaces, which is a major problem.

Figure 11B:
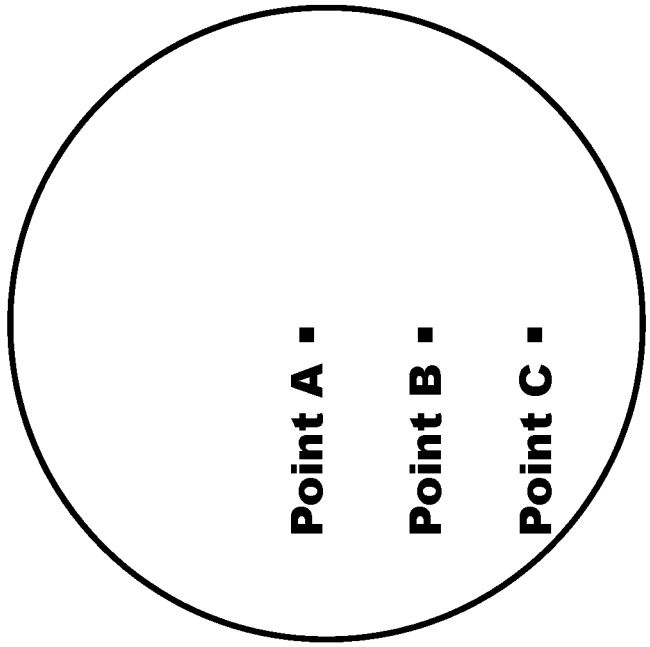
FIGS. 11(a) and 11(b) are schematics illustrating crystal orientations, according to an embodiment of the present invention.
Figure 11A:
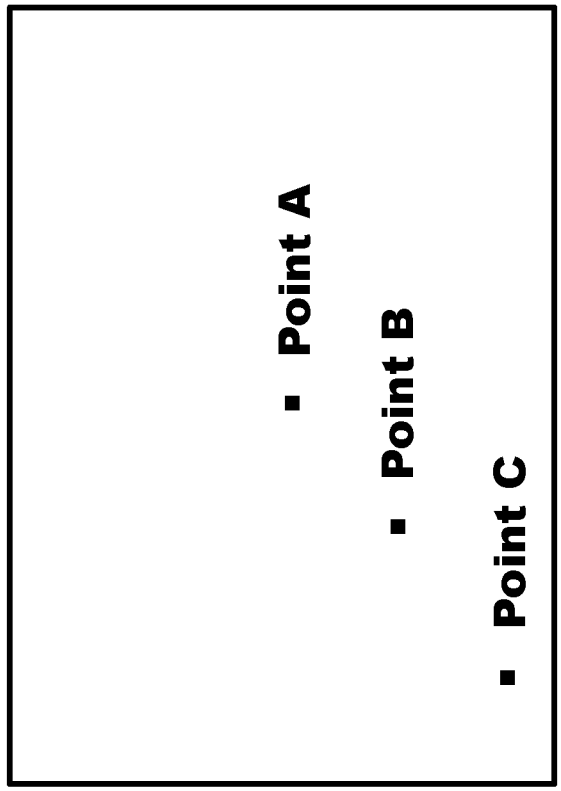

As shown in FIGS. 11(*a*)-11(*b*), the off-angle orientation is different at each point A, B and C. Consider an example where point A is an m-plane without an off-angle orientation, i.e., on-axis, point B has an off-angle orientation of 0.1 degrees from the m-plane, and point C has an off-angle orientation of 0.2 degrees from the m-plane. In this example, surface morphology is different at each point A, B and C.

The present invention, on the other hand, can avoid this problem and obtain a smooth surface at every point A, B and C, making mass production more efficient and lower cost.

Thus, in cases where the substrate 101 has a fluctuation of the in-plane distribution of off-angle orientations with more than 0.1 degrees, and more preferably more than 0.2 degrees, the present invention is very useful.

III-Nitride Semiconductor Device Layers

As a next step, III-nitride semiconductor device layers 106 have been grown on ELO III-nitride layers 105. For the growth of an AlGaN layer, triethylaluminium (TMA) is used as the raw gas; and for the growth of an InGaN layer, trimethylindium (TMI) is used as the raw gas. Under these conditions, the following layers have been grown on ELO III-nitride layers 105.

Figure 12:
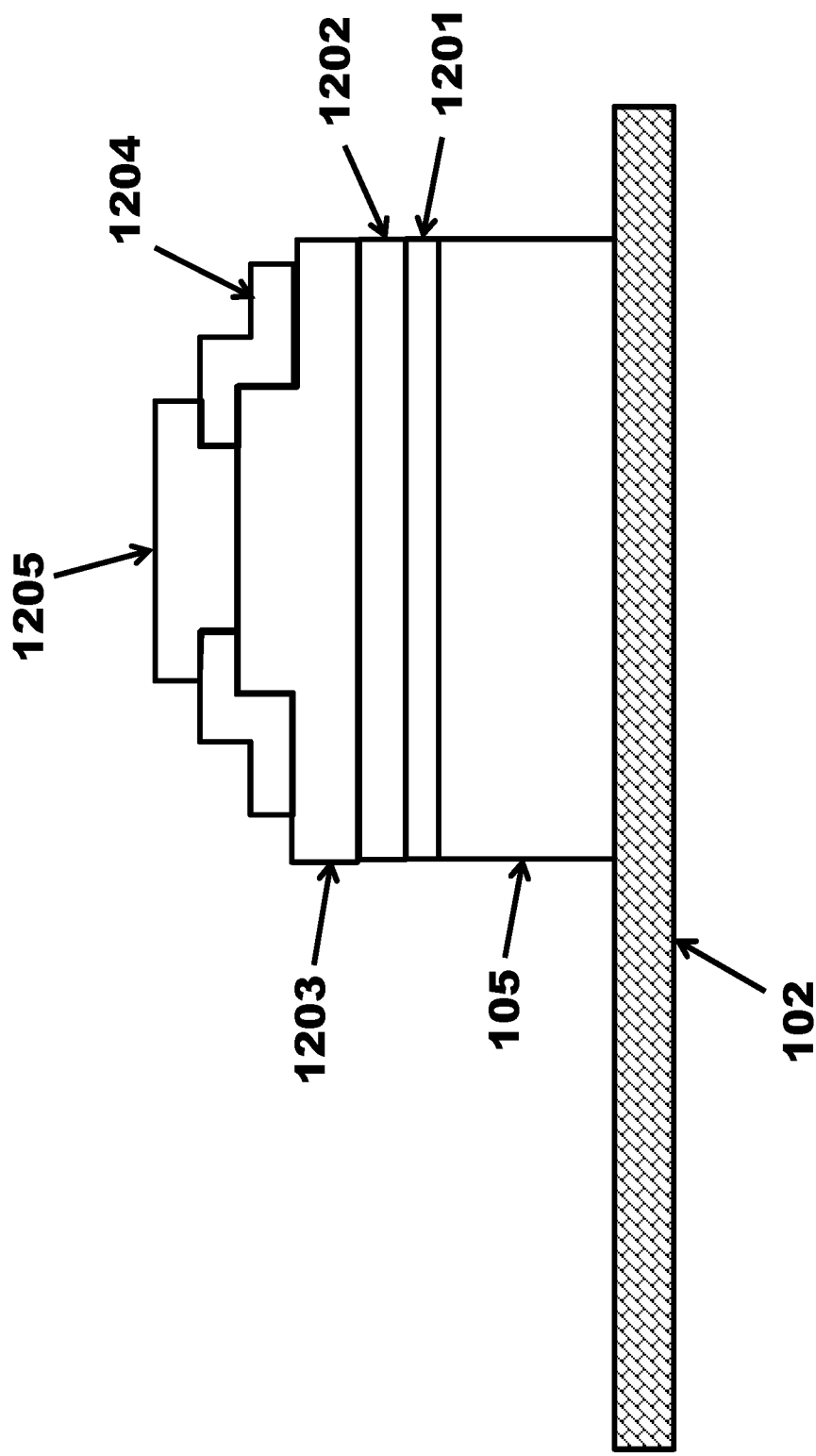
FIG. 12 is a schematic illustrating a device structure, according to an embodiment of the present invention.

FIG. 12 is a cross sectional view of a nitride semiconductor laser bar along the direction perpendicular to an optical resonator, wherein the optical resonator is comprised of a ridge stripe structure.

The nitride semiconductor laser has the following layers, laid one on top of another in the order mentioned, an ELO III-nitride layer 105 (which is a GaN layer), an InGaN/GaN 5 MQW active layer 1201 (8 nm×8 nm: 5 MQW), an AlGaN-EBL (electron blocking layer) layer 1202, a p-GaN guiding layer 1203, a $ZrO_2$ current limiting layer 1204, and a p-electrode 1205. Note that these III-nitride semiconductor layers may be formed of any nitride-based III-V group compound semiconductor grown in the above order.

The ridge stripe structure is comprised of the p-GaN cladding layer 1203, $ZrO_2$ current limiting layer 1204, and p-electrode 1205, provides optical confinement in a horizontal direction. The width of the ridge stripe structure is of the order of 1.0 to 20 μm, and typically is 10 μm.

In one embodiment, the p-electrode 1205 may be comprised of one or more of the following materials: Pd, Ni, Ti, Pt, Mo, W, Ag, Au, etc. For example, the p-electrode 1205 may comprise Pd-Ni-Au (with thicknesses of 3-30-300 nm). These materials may be deposited by electron beam evaporation, sputter, thermal heat evaporation, etc.

In addition, an ITO cladding layer may be added between p-GaN cladding layer 1203 and p-electrode 1205, as shown in FIG. 2(c).

Initial Growth

Figure 13:
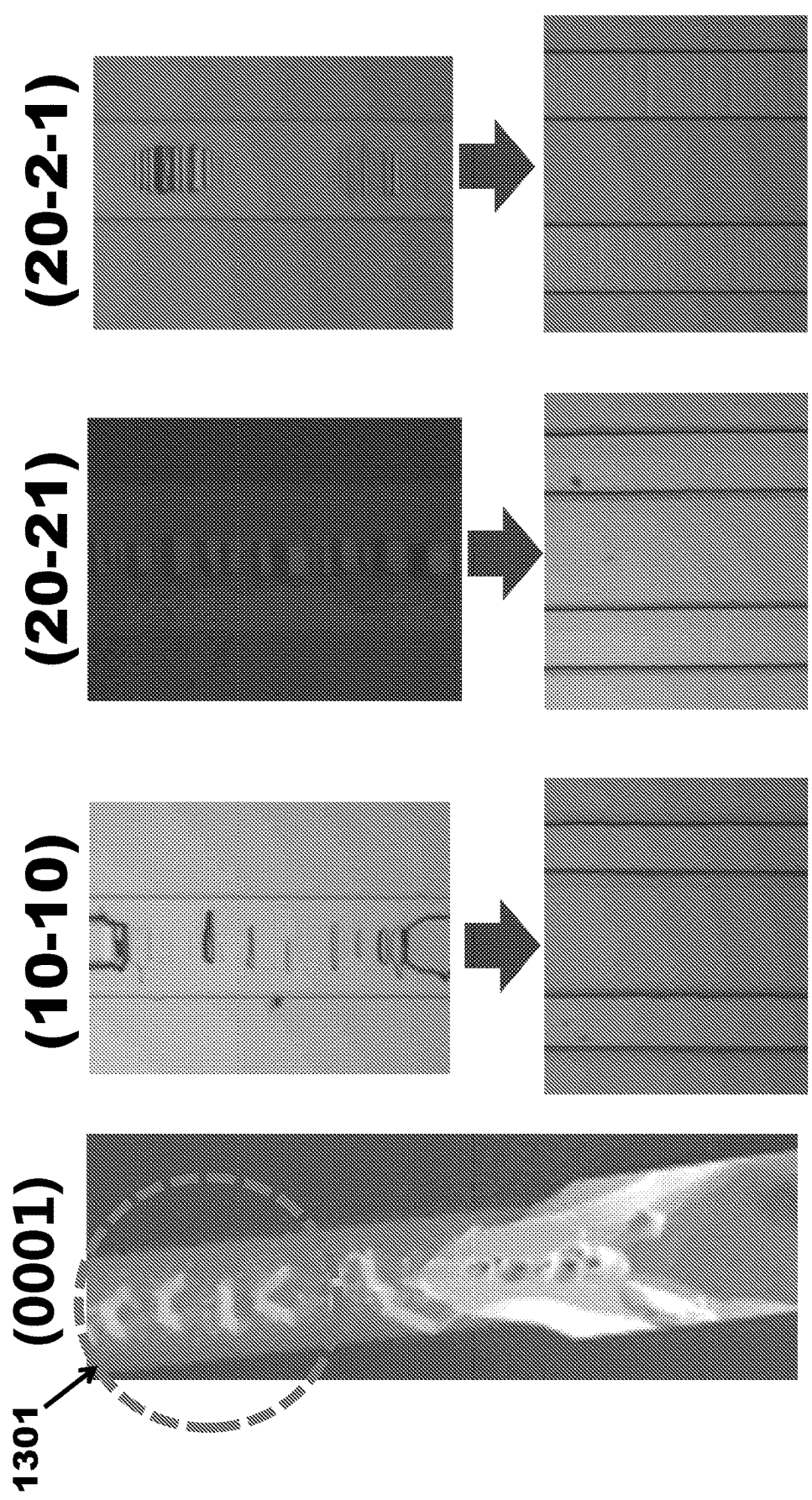
FIG. 13 is a series of photographs illustrating experimental results, according to the present invention.

To obtain a smooth surface with non-polar or semi-polar substrates 101, it is necessary to consider the mechanism of the initial growth, which is different from polar c-plane substrates. As shown in the images of FIG. 13, the initial growth on a polar c-plane substrate 101 with a (0001) surface shows an isotropic growth such as hexagonal shapes 1301. On the other hand, the initial growth of a non-polar substrate 101 that has an off-angle orientation tilting from the m-plane (10-10) to the c-plane, shows an anisotropic growth, also as shown in FIG. 13.

Figure 14:
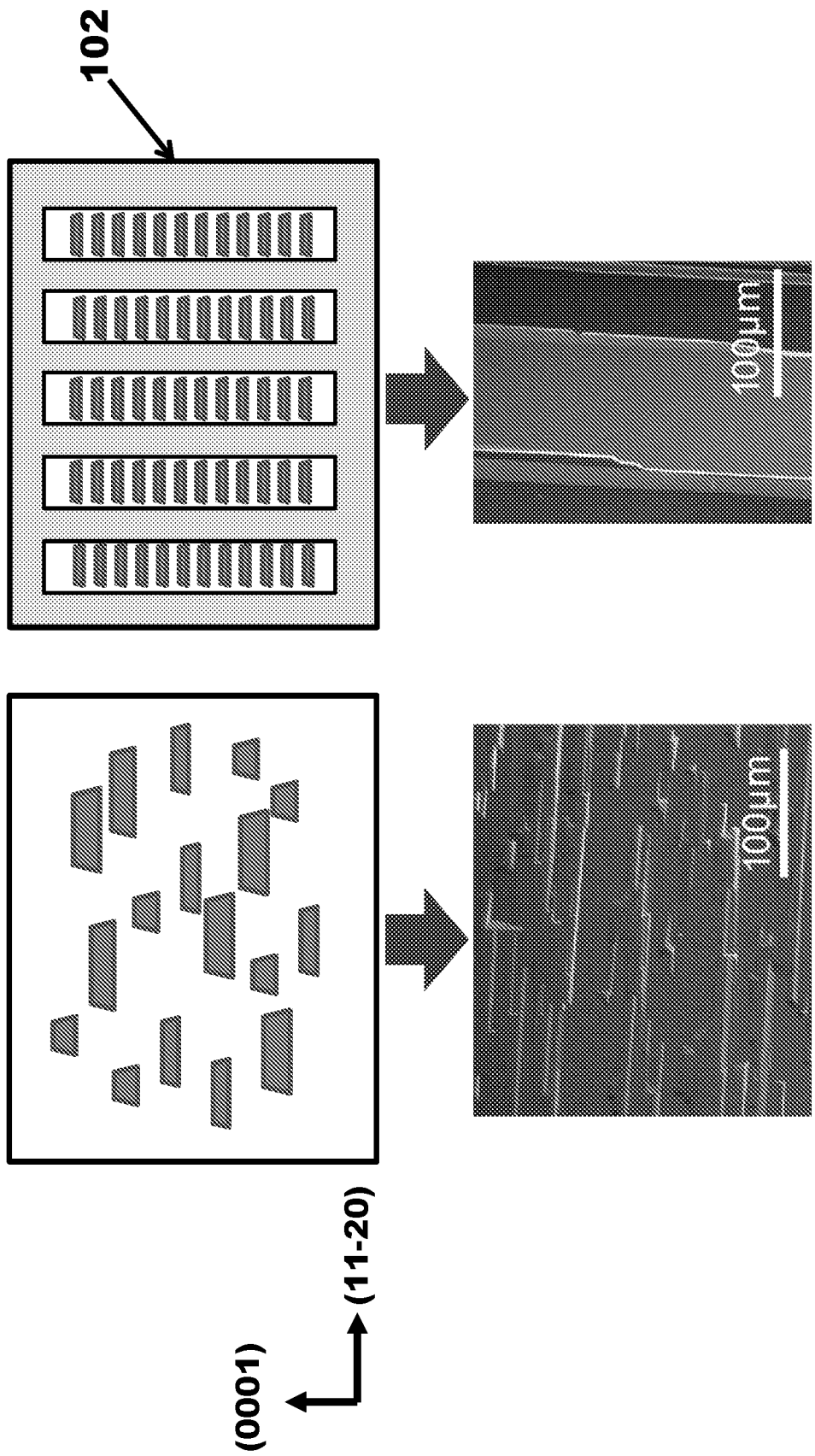
FIGS. 14(a) and 14(b) are schematics and photographs illustrating experimental results, according to the present invention.

This phenomenon has been explained by some researchers. For example, Lymperakis and Neugebauer have calculated the highly anisotropic diffusion barriers for Ga adatoms on m-plane GaN surfaces along the c- and a-directions as 0.93 eV and 0.21 eV, respectively. See Phys. Rev. B 79, 241308(R). It is thought that the anisotropic diffusion barriers for Ga adatoms cause the anisotropic initial growth. Besides, this anisotropic initial growth causes a large amount of surface roughness in the case where there is no limitation of the growth area, as shown for the initial growth of m-plane without a mask as shown in FIG. 14(a) and with a mask 102 as shown in FIG. 14(b).

Figure 17:
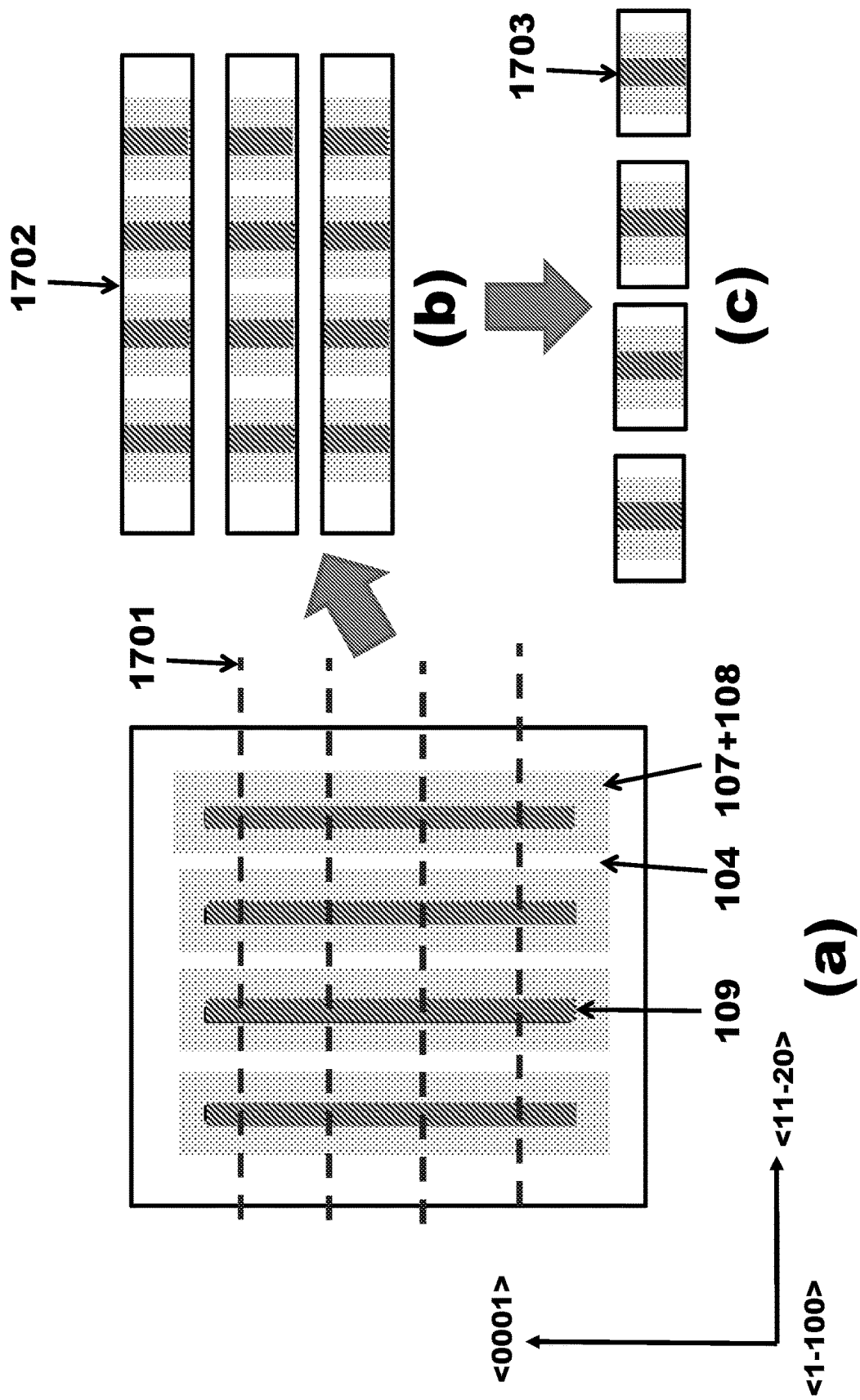
FIGS. 17(a), 17(b) and 17(c) are schematics illustrating growth of semiconductor layers on a growth restrict mask, according to an embodiment of the present invention.

For the above reasons, non-polar substrates 101 having an off-angle orientation tilting from the m-plane to the c-plane grow rapidly at the beginning of the growth in the long dimension along the a-axis rather than the c-axis. In this case, the growth restrict mask 102 can form openings 103 with long sides in the a-direction rather than projected with the c-axis, which makes the surface smooth due to being able to control the initial growth position and avoiding the coalescing of the initial growth from unintentional directions, as shown in FIGS. 16 and 17. A non-polar substrate 101 having an off-angle orientation of the m-plane oriented crystalline surface plane ranges from about +28 degrees to about −47 degrees towards a c-plane.

For the above reasons, these substrates might obtain a smooth surface using the growth restrict mask 102.

FIG. 13 also shows similar results to the non-polar (10-10) substrate 101 for semi-polar (20-21) and (20-2-1) substrates 101.

Edge Growth

The ELO III-nitride layers 105 have a just-orientation and an off-angle orientation from the m-plane oriented crystalline surface plane, wherein the off-angle orientation ranges from about +28 degrees to about −47 degrees toward a c-plane. The III-nitride semiconductor device layers 106 are grown on the ELO III-nitride layers 105. In this case, the edge growth has been restricted.

Figure 15:
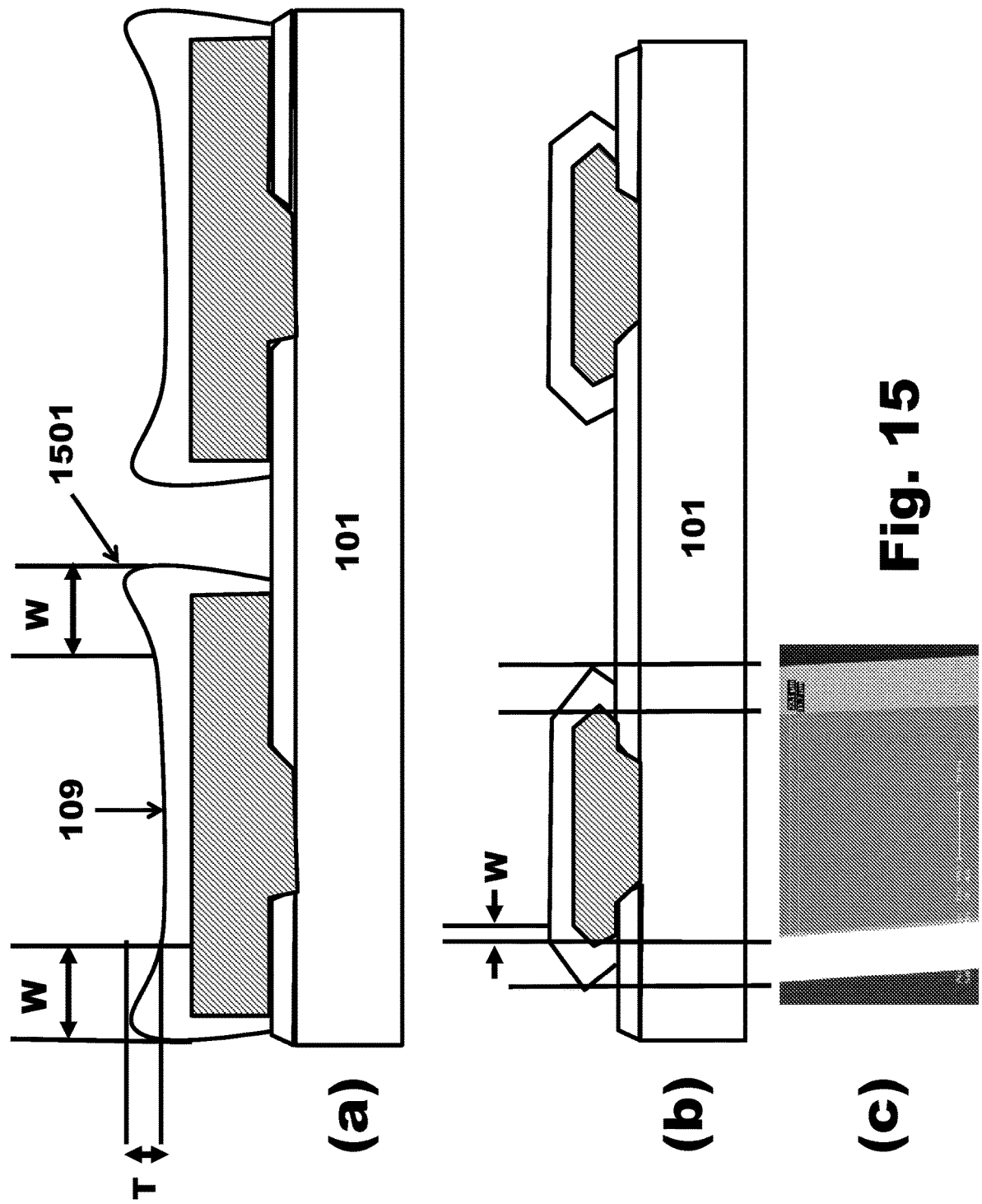
FIGS. 15(a) and 15(b) are schematics illustrating semiconductor growth structures.
FIG. 15(c) is a photograph of the structure of FIG. 15(b), according o an embodiment of the present invention.

As shown in FIGS. 15(a)-15(c), in the case of a c-plane substrate 101, there are the edge growth regions 1501 at the edges of the island-like III-nitride semiconductor layers 109. Generally, the width W of the edge growth regions 1501 is about 10-15 μm and the height T of the edge growth region 1501 is 0.3-0.4 μm. The edge growth region 1501 has a high growth rate, so that each layer thickness is different from at the center of the island-like III-nitride semiconductor layers 109.

In this case, it would be better to avoid forming the ridge stripe structure from the edge growth regions 1501, because the production yield would decrease due to the fluctuations of the thickness of the layers. In the case of the c-plane substrate 101, the edge growth region 1501 is wide and high. However, in the present invention, the height T is less than 0.2 μm, and the width W is about 5 μm.

Limiting the edge growth region 1501 is very important in the fabrication of the device. By optimizing growth conditions, the edge growth region 1501 can substantially disappear.

Making the Ridge Stripe Structure

Using conventional methods, such as photo-lithography and dry etching, a ridge stripe structure 301 is fabricated, as shown in FIGS. 3(a)-3(b), after MOCVD growth. The ridge depth (from the surface to the ridge bottom) is in the p-GaN guide layer. The ridge depth is pre-determined before dry etching is performed, based on simulation or previous experimental data.

Method of Making a Facet

As shown in FIGS. 3(a)-3(b), the etched mirror region 302 is located based on optical resonance length. The etching process for GaN etching uses an Ar ion beam and $Cl_2$ ambient gas. The etching depth is from about 1 μm to about 4 μm. The etched mirror facet may be coated by a dielectric film selected from the group of the following: $SiO_2$, $Al_2O_3$, AlN, AlON, SiN, SiON, $TiO_2$, $Ta_2O_5$, $Nb_2O_5$, $Zr_2O$, etc.

The III-Nitride Based Device Layers are Bonded to the Support Substrate

FIG. 2(d) shows the first support substrate 204, which is bonded to the island-like III-nitride semiconductor layers 109. Conventional bonding techniques can be adopted for the bonding.

In general, the most common types of flip-chip bonding are thermal compression bonding and wafer fusion/bonding. Wafer fusion has been popularly employed in InP-based devices. However, thermal compression bonding is generally much simpler than wafer fusion, as it uses metal-to-metal bonding, and has the benefit of also greatly improving thermal conductivity.

An Au—Au compression bond is by far the simplest bond and results in a fairly strong bond. An Au—Sn eutectic bond offers a much greater bond strength.

In one embodiment, a Cu substrate is used as the support substrate 204. A patterned Ti/Au electrode is fabricated on the Cu substrate by electron beam evaporation or sputter. The thickness of the electrode is Ti (10 nm), and Au (500 nm).

It is preferably to perform an activation of the surface for wafer bonding before compression bonding. The activation of the surface is achieved by using a plasma process of Ar and/or $O_2$. The island-like III-nitride semiconductor layers 109 are then bonded to the support substrate 204 at 150-300° C. under pressure.

Removing the Substrate by Thermal Expansion

The bonded wafer is dipped into a solvent for wet etching to remove the substrate 101. In one embodiment, the growth restrict mask 102 used is $SiO_2$, which is dissolved by an HF or BHF solvent. The merit of this technique is that there is no mechanical damage when the substrate 101 is removed (very gently), and a wide area of $SiO_2$ is dissolved by the HF very easily and quickly.

Thereafter, the wafer, which is bonded to the III-nitride substrate 101 and support substrate 204, is heated. A Cu support substrate 204 has a larger CTE (Coefficient of Thermal Expansion) than a GaN substrate 101. As shown FIG. 2(e), the expansion of the support substrate 204 due to heating applies strong stress to a cleaving point 205. Afterward, the cleaving starts at the cleaving point 205 towards an opposite side of a cleaving surface 206.

N-Electrode

As noted in FIG. 2(f), an n-electrode 207 is placed on the back side of the island-like III-nitride semiconductor layers 109. Typically, the n-electrode 207 is comprised of the following materials: Ti, Hf, Cr, Al, Mo, W, Pt, Au.

For example, the n-electrode 207 may be comprised of Ti—Al—Pt—Au (with a thickness of 30-100-30-500 nm), but is not limited to those materials. The deposition of these materials may be performed by electron beam evaporation, sputter, thermal heat evaporation, etc. Preferably, the p-electrode 207 is deposited on the ITO.

As shown in FIG. 16, the n-electrode (not shown) preferably is formed in a separate area 1601 on the back-side of the island-like III-nitride semiconductor layers 109, after the island-like III-nitride semiconductor layers 109 are removed from the substrate 101. This separate area 1601 has a good surface condition for the n-electrode to obtain low contact resistivity. Specifically, the present invention keeps this separate area 1601 clean until the island-like III-nitride semiconductor layers 109 are removed.

Chip Division Method

The chip division method has two steps. The first step is to scribe the island-like III-nitride semiconductor layers 109. The second step is to divide the support substrate 204 using a laser scribe, etc.

As shown in FIGS. 3(a)-3(b), the chip scribe line 303 is fabricated by a diamond scribing machine or laser scribe machine. The chip scribe line 303 is fabricated on the hack side of the island-like III-nitride semiconductor layers 109. The chip scribe line 303 may be a solid line or a dashed line.

Next, the support substrate 204 is divided by laser scribing as well to obtain an LD device. It is better to avoid the ridge strip structure when the chip scribe line 303 is fabricated.

Second Embodiment

A second embodiment is almost the same as the first embodiment, except that it does not remove the island-like III-nitride semiconductor layers 109. The steps of the fabrication method are the same as the first embodiment, until step 3 (TCO p-pad deposition+ridge process). In the second embodiment, the island-like III-nitride semiconductor layers 109 do not bond to the support substrate 204. The following process is the same of conventional device process.

4. Polishing the substrate 101 until it is 80-100 μm in thickness.

5. Forming an n-electrode on the back side of the substrate 101.

6. Separating the substrate 101 into the bars, as shown in FIGS. 17(a)-17(b), wherein FIG. 17(a) shows the flat surface regions 107, layer bending regions 108, and island-like III-nitride based semiconductor layers 109, separated by no-growth regions 104, as well as scribe lines 1701; and FIG. 17(b) shows the devices separated along the scribe lines 1701 into bars 1702.

7. Facet coating (using the same method as mentioned in the first embodiment).

8. Separating the bars 1702 into individual devices or chips 1703, as shown in FIGS. 17(b)-17(c).

By doing this, the devices 1703 can be obtained without removing the island-like III-nitride semiconductor layers 109 from the substrate 101. By using the method of this second embodiment, the same effect as the first embodiment is obtained.

Modifications and Alternatives

A number of modifications and alternatives can be made without departing from the scope of the present invention.

For example, the present invention may be used with III-nitride substrates of other orientations. Specifically, the substrates may be basal non-polar m-plane {1 0 −1 0} families; and semi-polar plane families that have at least two nonzero h, i, or k Miller indices and a nonzero 1 Miller index, such as the {2 0 −2 −1} planes. Semi-polar substrates of (20-2-1) are especially useful, because of the wide area of flattened ELO growth.

In another example, the present invention is described as being used to fabricate different opto-electronic device structures, such as a light-emitting diode (LED), laser diode (LD), Schottky barrier diode (SBD), or metal-oxide-semiconductor field-effect-transistor (MOSFET). The present invention may also be used to fabricate other opto-electronic devices, such as micro-LEDs, vertical cavity surface emitting lasers (VCSELs), edge-emitting laser diodes (EELDs), and solar cells.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A device, comprising:
one or more island-like III-nitride semiconductor layers having a just-orientation and an off-angle orientation of an m-plane oriented crystalline surface plane, wherein:
the island-like III-nitride semiconductor layers are grown in opening areas in a growth restrict mask deposited on a substrate;
the just-orientation of the m-plane oriented crystalline surface plane of the island-like III-nitride semiconductor layers is towards an a-axis of the island-like III-nitride semiconductor layers;
the off-angle orientation of the m-plane oriented crystalline surface plane of the island-like III-nitride semiconductor layers ranges from about +28 degrees to about −47 degrees towards a c-plane of the island-like III-nitride semiconductor layers;
the island-like III-nitride semiconductor layers have at least one long side and short side, wherein the long side is perpendicular to an a-axis of the island-like III-nitride semiconductor layers;
the island-like III-nitride semiconductor layers have an edge growth region at the short side of the island-like III-nitride semiconductor layers where growth of the island-like III-nitride semiconductor layers is restricted with a height less than 0.2 µm; and
the island-like III-nitride semiconductor layers have a flat surface region without hillocks.

2. The device of claim 1, wherein the growth restrict mask is isolated from an edge of the III-nitride substrate.

3. The device of claim 2, wherein the island-like III-nitride semiconductor layers are removed from the III-nitride substrate.

4. The device of claim 1, wherein the island-like III-nitride semiconductor layers have an emitting region.

5. The device of claim 4, wherein the emitting region is at least 1 µm from an edge of a layer bending region of the island-like III-nitride semiconductor layers, and the layer bending region is a region including a bended active region.

6. The device of claim 4, wherein the emitting region is more than 5 µm from an edge of a top surface of the island-like III-nitride semiconductor layers.

7. The device of claim 1, wherein the edge growth region has a width less than 5 µm.

8. The device of claim 1, wherein the island-like III-nitride semiconductor layers have a separate region where an n-electrode is formed.

9. A method of fabricating a semiconductor device, comprising:
forming a growth restrict mask on or above a III-nitride substrate, wherein:
the III-nitride substrate has an in-plane distribution of off-angle orientations with more than 0.1 degrees; and
the off-angle orientations of an m-plane oriented crystalline surface plane ranges from about +28 degrees to about −47 degrees towards a c-plane; and
growing one or more island-like III-nitride semiconductor layers on the III-nitride substrate using the growth restrict mask;
wherein:
the island-like III-nitride semiconductor layers have a just-orientation of an m-plane oriented crystalline surface plane towards an a-axis;
the island-like III-nitride semiconductor layers have the off-angle orientations of the m-plane oriented crystalline surface plane ranges from about +28 degrees to about −47 degrees towards a c-plane;
the island-like III-nitride semiconductor layers have at least one long side and short side, wherein the long side is perpendicular to an a-axis of the island-like III-nitride semiconductor layers;
the island-like III-nitride semiconductor layers have an edge growth region at the short side of the island-like III-nitride semiconductor layers where growth of the island-like III-nitride semiconductor layers is restricted with a height less than 0.2 µm;
the island-like III-nitride semiconductor layers have a flat surface region without hillocks.

10. The method of claim 9, wherein the island-like III-nitride semiconductor layers are removed from the III-nitride substrate.

11. The method of claim 9, wherein the island-like III-nitride semiconductor layers have an emitting region.

12. The method of claim 11, wherein the emitting region is at least 1 µm from an edge of a layer bending region of the island-like III-nitride semiconductor layers, and the layer bending region is a region including a bended active region.

13. The method of claim 11, wherein the emitting region is more than 5 µm from an edge of a top surface of the island-like III-nitride semiconductor layers.

14. The method of claim 9, wherein the edge growth region has a width less than 5 µm.

15. The method of claim 9, wherein the island-like III-nitride semiconductor layers have a separate region where an n-electrode is formed.

16. The method of claim 9, wherein the growth restrict mask is isolated from an edge of the III-nitride substrate.

17. The method of claim 9, wherein the island-like III-nitride semiconductor layers do not coalesce with neighboring island-like III-nitride semiconductor layers, resulting in a no-growth region on the growth restrict mask between the island-like III-nitride semiconductor layers and the neighboring island-like III-nitride semiconductor layers.

18. The device of claim 1, wherein the island-like III-nitride semiconductor layers do not coalesce with neighboring island-like III-nitride semiconductor layers, resulting in a no-growth region on the growth restrict mask between the island-like III-nitride semiconductor layers and the neighboring island-like III-nitride semiconductor layers.

* * * * *